US012650478B2

(12) United States Patent
Kato et al.

(10) Patent No.: US 12,650,478 B2
(45) Date of Patent: Jun. 9, 2026

(54) OPTICAL EXCITATION MAGNETIC SENSOR MODULE

(71) Applicant: HAMAMATSU PHOTONICS K.K., Hamamatsu (JP)

(72) Inventors: Norihisa Kato, Hamamatsu (JP); Masaki Yamada, Hamamatsu (JP); Fusanori Kondo, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 117 days.

(21) Appl. No.: 18/696,064

(22) PCT Filed: Jul. 6, 2022

(86) PCT No.: PCT/JP2022/026818
§ 371 (c)(1),
(2) Date: Mar. 27, 2024

(87) PCT Pub. No.: WO2023/053655
PCT Pub. Date: Apr. 6, 2023

(65) Prior Publication Data
US 2024/0385265 A1      Nov. 21, 2024

(30) Foreign Application Priority Data

Oct. 1, 2021     (JP) ................................. 2021-162567

(51) Int. Cl.
*G01R 33/26*          (2006.01)
(52) U.S. Cl.
CPC .................................... *G01R 33/26* (2013.01)

(58) Field of Classification Search
CPC ... G01R 33/26; G01R 33/0094; G01R 33/032
(Continued)

(56) References Cited

U.S. PATENT DOCUMENTS 10,509,369 B1     12/2019   Lemke et al.
11,630,170 B2 *    4/2023   Hughes .................. G01R 33/26
                                                                 324/301
(Continued)

FOREIGN PATENT DOCUMENTS

CN          110646752 A      1/2020
JP             5444502 B2      3/2014
(Continued)

OTHER PUBLICATIONS

Translation of JP 2019124556 (Year: 2019).*
(Continued)

*Primary Examiner* — Christopher P McAndrew
(74) *Attorney, Agent, or Firm* — Faegre Drinker Biddle & Reath LLP

(57)          ABSTRACT

An optically pumped magnetometer module includes a housing and a cell unit disposed in the housing. The cell unit has a cell enclosing an alkali metal, a heat conductive member covering the cell, and a heater provided to the heat conductive member. The cell includes a main body portion having a light-passing region through which at least one of pump light and probe light passes. The heat conductive member is continuously provided over an entire region of an outer surface of the main body portion excluding the light-passing region.

15 Claims, 13 Drawing Sheets

(58) Field of Classification Search
USPC ........................................................ 324/302
See application file for complete search history.

(56) References Cited

U.S. PATENT DOCUMENTS

| | | | | |
|---|---|---|---|---|
| 11,821,966 | B1 * | 11/2023 | Schwindt .............. | H01S 5/0687 |
| 11,841,404 | B1 * | 12/2023 | Schwindt ........... | G01R 33/0322 |
| 2011/0031969 | A1 | 2/2011 | Kitching et al. | |
| 2014/0320123 | A1 * | 10/2014 | Kobayashi ............. | G01R 33/26 |
| | | | | 324/244.1 |
| 2018/0315536 | A1 | 11/2018 | Tarashansky et al. | |
| 2020/0110141 | A1 | 4/2020 | Kato et al. | |
| 2021/0041513 | A1 * | 2/2021 | Mohseni .............. | G01R 33/032 |
| 2021/0063970 | A1 | 3/2021 | Nagasaka | |
| 2021/0373096 | A1 * | 12/2021 | Le Gal ................. | G01R 33/022 |
| 2021/0405136 | A1 * | 12/2021 | Arroyo Camejo ... | G01R 33/323 |

FOREIGN PATENT DOCUMENTS

| | | | |
|---|---|---|---|
| JP | 5666687 | B2 | 2/2015 |
| JP | 2017-072420 | A | 4/2017 |
| JP | 2017-215226 | A | 12/2017 |
| JP | 2018-136217 | A | 8/2018 |
| JP | 2019-124556 | A | 7/2019 |
| JP | 2020-060378 | A | 4/2020 |
| JP | 2021-034641 | A | 3/2021 |
| WO | WO-2012/120732 | A1 | 9/2012 |
| WO | WO-2012/124036 | A1 | 9/2012 |

OTHER PUBLICATIONS

Extended European Search Report issued on Jul. 17, 2025 in corresponding European patent application 22875534.4.

Liu Zhi et.al, "Indium Tin Oxide Non-Magnetic Heating Film for Miniaturized SERF Gradient Magnetometer", IEEE SENSORS JOURNAL, IEEE,vol. 21, No. 15,, Apr. 28, 2021, p. 16554-p. 16559, XP011867789.

Zhang Ji et.al, "A Novel Asymmetrical Heating Method for Improving the Temperature Spatial Homogeneity of Vapor Cell in Atomic Magnetometer", IEEE Access,vol. 7, 12, Jun. 12, 2019, p. 71245-p. 71251, XP011729420.

International Preliminary Report on Patentability mailed Apr. 11, 2024 for PCT/JP2022/026818.

European Search Report issued on Oct. 16, 2025 in corresponding European patent application 22875534.4.

* cited by examiner

OPTICAL EXCITATION MAGNETIC SENSOR MODULE

TECHNICAL FIELD

The present disclosure relates to an optically pumped magnetometer module.

BACKGROUND ART

Patent Literature 1 describes an optically pumped magnetometer module including an atomic vapor cell enclosing an alkali metal, a holding member that holds the atomic vapor cell, and a heater thermally connected to the holding member. According to the optically pumped magnetometer module described in Patent Literature 1, the heat of the heater is transmitted to the light transmission part of the atomic vapor cell via the holding member, whereby the alkali metal in the atomic vapor cell is heated.

In such an optically pumped magnetometer module, first, the alkali metal enclosed in the cell is heated to obtain vapor atoms of the alkali metal (alkali metal vapor). Then, the alkali metal vapor is brought into a spin-polarized state by optical pumping. Furthermore, when the atoms of the alkali metal are affected by the magnetism, their spin polarization rotates by receiving torque, and the direction changes (the rotation angle changes). This change in the direction of the spin polarization is acquired by irradiation with probe light. In this way, the optically pumped magnetometer module measures a magnetic field of a measurement target. In the measurement of the magnetic field using such an alkali metal, it is important to fill the inside of the cell enclosing the alkali with the alkali metal vapor.

CITATION LIST

Patent Literature

Patent Literature 1: Japanese Unexamined Patent Publication No. 2017-72420

SUMMARY OF INVENTION

Technical Problem

In the optically pumped magnetometer module described in Patent Literature 1, since the holding member is thermally connected only to a part of the atomic vapor cell, the part of the atomic vapor cell is heated earlier than the other part, and the heating of the atomic vapor cell may be non-uniform. When the heating of the atomic vapor cell becomes non-uniform, due to the fact that the vapor pressure of the alkali metal in the atomic vapor cell is controlled by the temperature of the relatively low temperature portion inside the atomic vapor cell, a sufficient vapor pressure of the alkali metal cannot be obtained in the magnetic measurement, and as a result, the sensitivity and stability as the optically pumped magnetometer module may be deteriorated.

An object of the present disclosure is to provide an optically pumped magnetometer module capable of uniformly heating a cell enclosing an alkali metal.

Solution to Problem

An optically pumped magnetometer module according to one aspect of the present disclosure includes a housing; and a cell unit disposed in the housing, the cell unit has a cell enclosing an alkali metal, a first heat conductive member covering the cell, and a heater provided to the first heat conductive member, the cell includes a main body portion having a light-passing region through which at least one of pump light and probe light passes, and the first heat conductive member is continuously provided over an entire region of an outer surface of the main body portion excluding the light-passing region.

In the optically pumped magnetometer module, the first heat conductive member is continuously provided over the entire region of the outer surface of the main body portion excluding the light-passing region through which at least one of the pump light and the probe light passes. As a result, the heat generated from the heater is conducted to the entire cell via the first heat conductive member, such that the cell is uniformly heated. Therefore, according to the optically pumped magnetometer module, it is possible to uniformly heat the cell enclosing the alkali metal.

In the optically pumped magnetometer module according to one aspect of the present disclosure, the first heat conductive member may have an opening corresponding to the light-passing region, the cell unit may further have a heat insulating member covering the first heat conductive member and the heater, and the heat insulating member may be provided over an entire portion of the first heat conductive member excluding the opening. This suppresses the release of the heat to an outside of the cell unit. As a result, the cell can be heated more efficiently, and a temperature rise of the housing can be suppressed.

The optically pumped magnetometer module according to one aspect of the present disclosure may further include a second heat conductive member disposed in the housing, and the second heat conductive member may be provided on an inner surface of the housing. As a result, the heat generated in the cell unit is conducted to the entire second heat conductive member. As a result, for example, when the optically pumped magnetometer module is brought close to a measurement target, it is possible to suppress the optically pumped magnetometer module from adversely affecting the measurement target due to a locally high temperature of the housing.

The optically pumped magnetometer module according to one aspect of the present disclosure may further include a light receiving element that is disposed in the housing and receives the probe light emitted from the cell, and the second heat conductive member may not be provided in a region of the inner surface of the housing, the region corresponding to the light receiving element. As a result, the heat conducted to the second heat conductive member is prevented from being conducted to the light receiving element, such that an increase in the temperature of the light receiving element is suppressed. As a result, since an increase in a dark current in the light receiving element is suppressed, a decrease in an SN ratio in a signal from the light receiving element can be avoided.

The optically pumped magnetometer module according to one aspect of the present disclosure may further include a substrate on which the light receiving element is mounted, and the second heat conductive member may not be provided in regions of the inner surface of the housing, the regions corresponding to the light receiving element and the substrate. As a result, the heat conducted to the second heat conductive member is prevented from being conducted to the substrate, such that the temperature of the substrate and the temperature of the light receiving element mounted on the substrate are suppressed from rising. As a result, thermal damage to the substrate and the increase in the dark current in the light receiving element are suppressed, such that the decrease in the SN ratio in the signal from the light receiving element can be avoided.

In the optically pumped magnetometer module according to one aspect of the present disclosure, the light-passing region may include an incidence region of the pump light, an incidence region of the probe light, and an emission region of the probe light facing the incidence region of the probe light in a second direction perpendicular to a first direction in which the pump light is incident on the incidence region of the pump light, and a width of the incidence region of the pump light in a third direction perpendicular to both the first direction and the second direction may be larger than a width of each of the incidence region of the probe light and the emission region of the probe light in the third direction. This makes it possible to more reliably pump the alkali metal vapor in an optical path of the probe light.

In the optically pumped magnetometer module according to one aspect of the present disclosure, an area of the incidence region of the pump light may be larger than an area of each of the incidence region of the probe light and the emission region of the probe light. This makes it possible to more reliably pump the alkali metal vapor in an optical path of the probe light.

The optically pumped magnetometer module according to one aspect of the present disclosure may further include a support disposed in the housing and configured to position the cell unit at a predetermined position in the housing. As a result, the cell is accurately fixed to a predetermined place in the housing. As a result, it is possible to more accurately measure the magnetic field in the measurement target.

In the optically pumped magnetometer module according to one aspect of the present disclosure, the housing may have a wall portion, and the cell unit may be disposed in the housing such that no space is formed between the wall portion and the cell unit. As a result, for example, when the outer surface of the wall portion is brought close to the measurement target, a distance between the cell unit and the measurement target becomes smaller. As a result, the magnetic field in the measurement target can be measured with higher sensitivity.

Advantageous Effects of Invention

According to the present disclosure, it is possible to provide an optically pumped magnetometer module capable of uniformly heating a cell enclosing an alkali metal.

DESCRIPTION OF EMBODIMENTS

Figure 1:
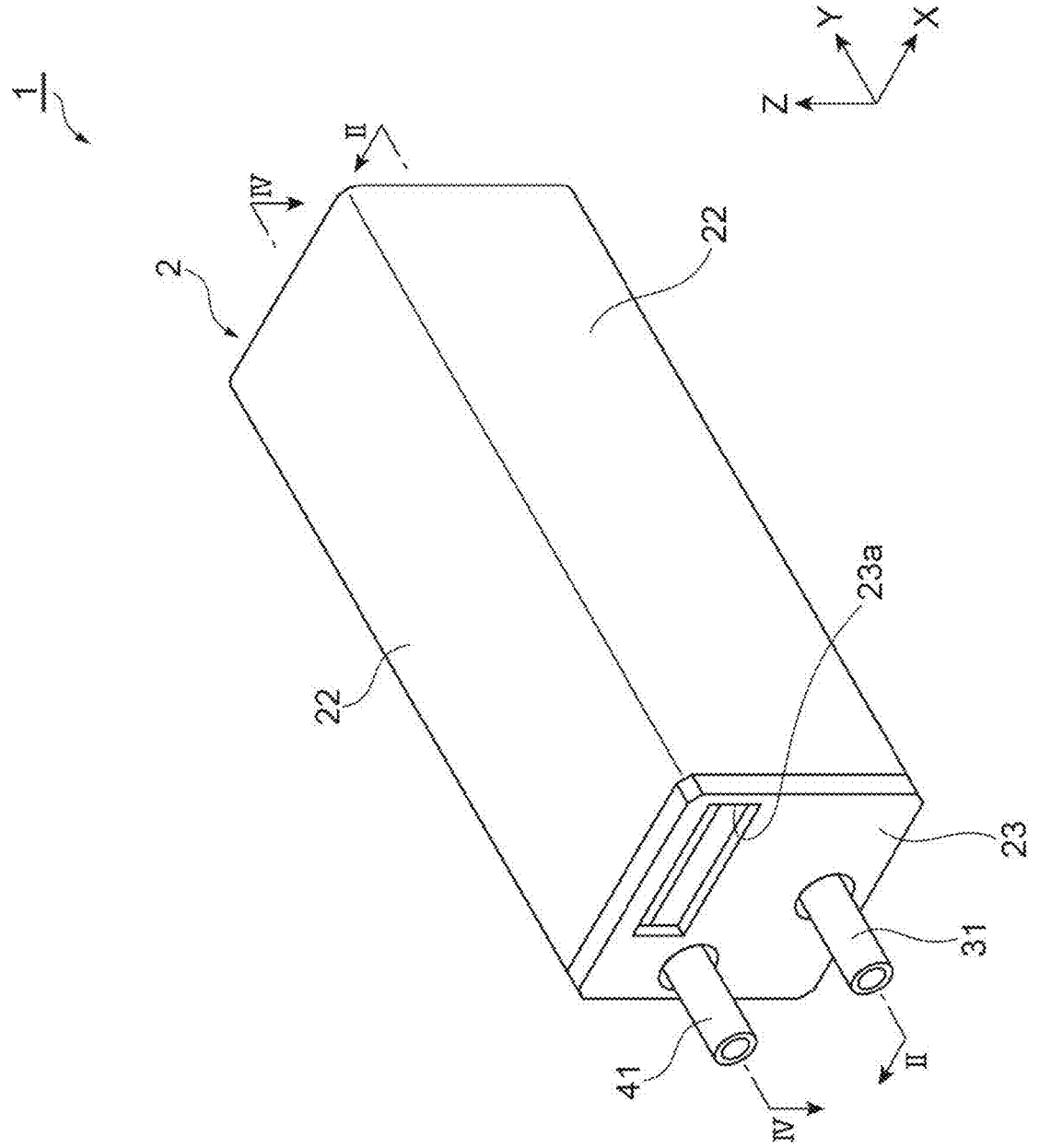
FIG. 1 is a perspective view of an optically pumped magnetometer module according to an embodiment.

Hereinafter, an embodiment of the present disclosure will be described in detail with reference to the drawings. In the drawings, the same or corresponding portions are denoted by the same reference numerals, and redundant portions are omitted.

[Configuration of Optically Pumped Magnetometer Module]

Figure 2:
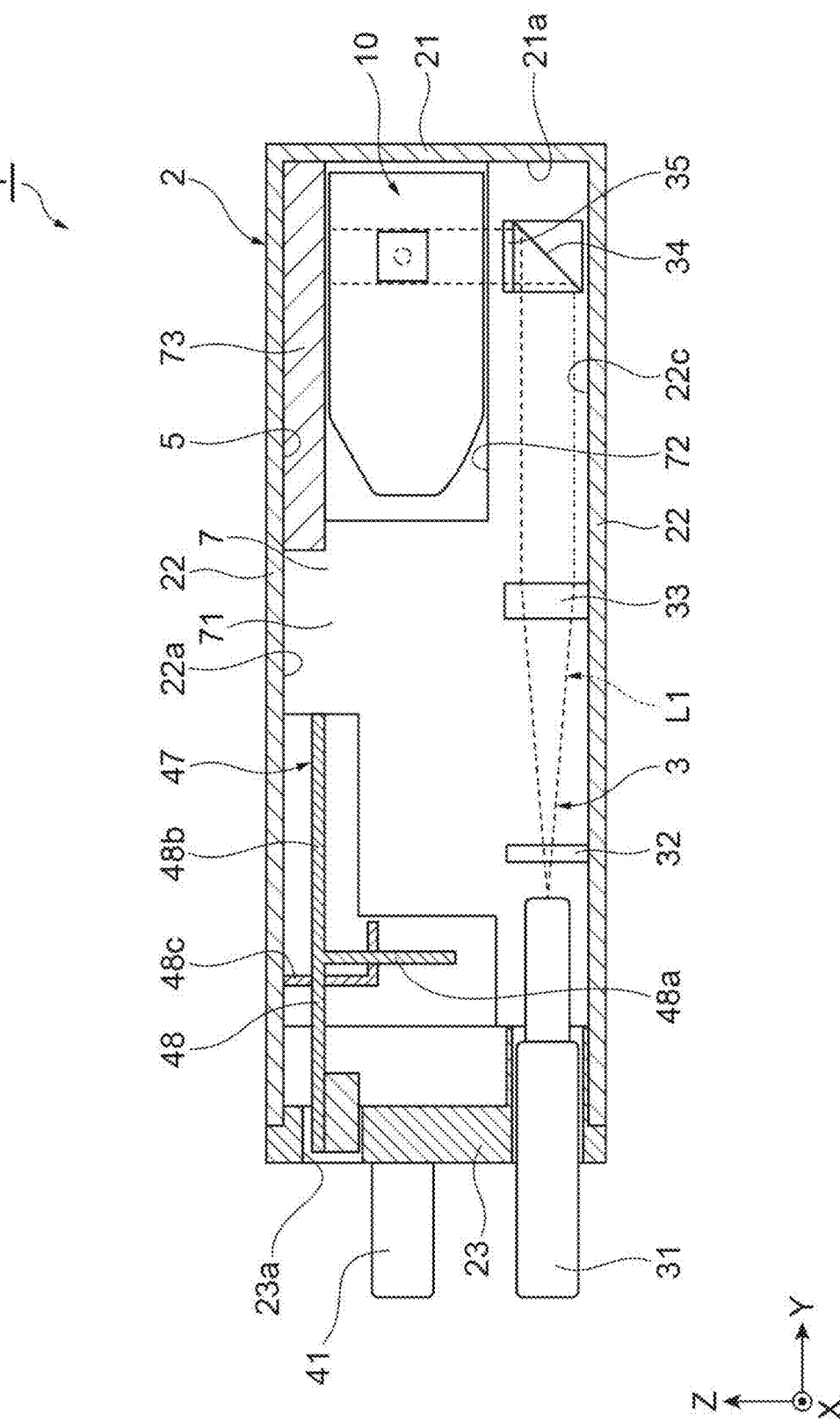
FIG. 2 is a cross-sectional view of the optically pumped magnetometer module taken along line II-II illustrated in FIG. 1.
Figure 3:
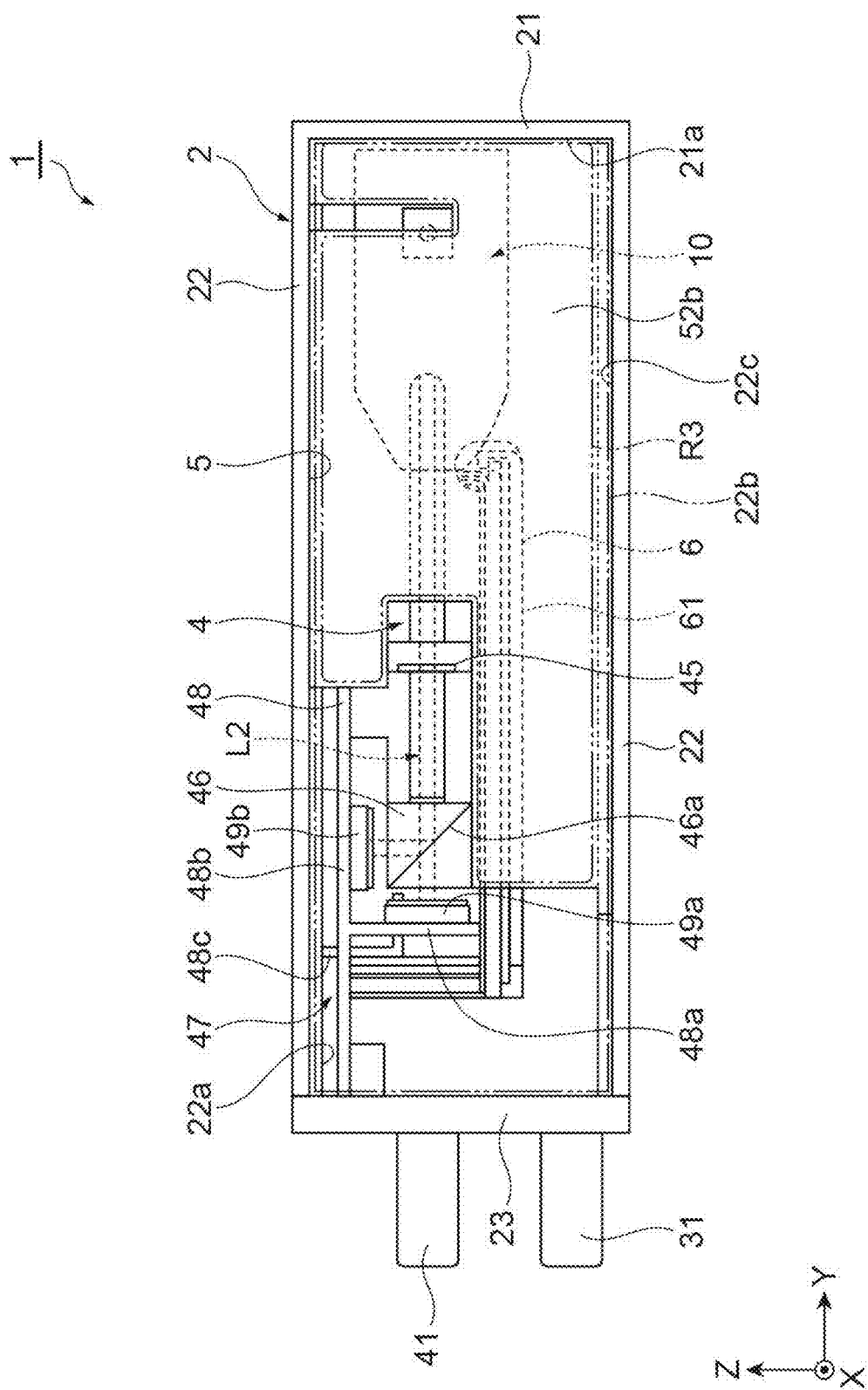
FIG. 3 is a left side view of the optically pumped magnetometer module illustrated in FIG. 1.

As illustrated in FIGS. 1, 2, 3, and 4, an optically pumped magnetometer module 1 includes a housing 2, a first optical system 3, a second optical system 4, a heat conductive member (second heat conductive member) 5, a plurality of wirings 6, a support 7, and a cell unit 10. The heat conductive member 5, the plurality of wirings 6, the support 7, and the cell unit 10 are disposed in the housing 2. In the following description, three directions perpendicular to each other are referred to as an X direction, a Y direction, and a Z direction, respectively. In the present embodiment, the Z direction is a first direction, the X direction is a second direction perpendicular to the first direction, and the Y direction is a third direction perpendicular to both the first direction and the second direction. In FIG. 3, a second wall portion 22 having an inner surface 22b is not illustrated.

The housing 2 has, for example, a rectangular parallelepiped shape. The housing 2 has a first wall portion (wall portion) 21, a plurality of (four in the present embodiment) second wall portions 22, and a third wall portion 23. The first wall portion 21 and the third wall portion 23 face each other in the Y direction. Each of the first wall portion 21 and the third wall portion 23 has, for example, a square plate shape. A pair of second wall portions 22 face each other in the Z direction. The other pair of second wall portions 22 face each other in the X direction. Each of the second wall portions 22 has, for example, a rectangular plate shape with the Y direction as a longitudinal direction. Each of the second wall portions 22 is connected to each of the first wall portion 21 and the third wall portion 23. In the present embodiment, the first wall portion 21 and the plurality of second wall portions 22 are integrally formed of, for example, an ABS resin. The first wall portion 21 has an inner surface 21a. The plurality of second wall portions 22 have inner surfaces 22a, 22b, 22c, and 22d. The inner surface 22a and the inner surface 22c face each other in the Z direction. The inner surface 22b and the inner surface 22d face each other in the X direction. The third wall portion 23 has an opening 23a. The opening 23a has, for example, a rectangular shape.

The first optical system 3 has a fiber connector 31, a polarizer 32, a lens 33, a mirror 34, and a ¼ wavelength plate 35. The first optical system 3 guides pump light L1 from an outside of the housing 2 to the cell unit 10. The fiber connector 31 is attached to the support 7 in a state of penetrating the third wall portion 23. An optical fiber that transmits the pump light L1 is connected to the fiber connector 31. The polarizer 32, the lens 33, the mirror 34, and the ¼ wavelength plate 35 are attached to the support 7 in a state of being disposed in the housing 2 along the inner surface 22c of the second wall portion 22. The polarizer 32, the lens 33, and the mirror 34 are arranged along the Y direction in this order from the fiber connector 31 side. The ¼ wavelength plate 35 is disposed between the mirror 34 and the cell unit 10. The polarizer 32 linearly polarizes the pump light L1 emitted from the fiber connector 31. The lens 33 collimates the pump light L1 that has passed through the polarizer 32. The ¼ wavelength plate 35 makes the pump light L1 reflected by the mirror 34 elliptically polarized. In the first optical system 3, the pump light L1 emitted from the fiber connector 31 passes through the polarizer 32 and the lens 33, is reflected by the mirror 34, then passes through the ¼ wavelength plate 35, and is incident on the cell unit 10.

The second optical system 4 has a fiber connector 41, a lens 42, a polarizer 43, a pair of mirrors 44a and 44b, a ½ wavelength plate 45, a polarization beam splitter 46, and a light receiving unit 47. The second optical system 4 guides probe light L2 from the outside of the housing 2 to the cell unit 10, and guides the probe light L2 from the cell unit 10 to the light receiving unit 47. The fiber connector 41 is attached to the support 7 in a state of penetrating the third wall portion 23. An optical fiber that transmits the probe light L2 is connected to the fiber connector 41. The lens 42, the polarizer 43, and the mirror 44a are attached to the support 7 in a state of being disposed in the housing 2 along the inner surface 22d of the second wall portion 22. The lens 42, the polarizer 43, and the mirror 44a are arranged along the Y direction in this order from the fiber connector 41 side. The mirror 44b, the ½ wavelength plate 45, the polarization beam splitter 46, and the light receiving unit 47 are attached to the support 7 in a state of being disposed in the housing 2 along the inner surface 22b of the second wall portion 22. The mirror 44b, the ½ wavelength plate 45, the polarization beam splitter 46, and the light receiving unit 47 are arranged along the Y direction in this order from the first wall portion 21 side. The lens 42 collimates the probe light L2 emitted from the fiber connector 41. The polarizer 43 linearly polarizes the probe light L2 having passed through the lens 42. In the probe light L2 having passed through the cell unit 10, the ½ wavelength plate 45 generates a phase difference of ½ wavelength between the light in a first polarization direction and light in a second polarization direction perpendicular to light in the first polarization direction. The polarization beam splitter 46 is a cube-type beam splitter having an optical functional surface 46a. The polarization beam splitter 46 transmits the light in the first polarization direction and reflects the light in the second polarization direction.

The light receiving unit 47 has a substrate 48, a first light receiving element 49a, and a second light receiving element 49b. The first light receiving element 49a and the second light receiving element 49b are mounted on the substrate 48. The substrate 48 includes a first plate portion 48a, a second plate portion 48b, and a connection member 48c. The first plate portion 48a extends along the third wall portion 23. The second plate portion 48b extends along the inner surface 22a of the second wall portion 22. A part of the second plate portion 48b is disposed inside the opening 23a. The first plate portion 48a and the second plate portion 48b are connected to each other via the connection member 48c. The first light receiving element 49a is disposed on the surface of the first plate portion 48a on the polarization beam splitter 46 side. The second light receiving element 49b is disposed on the surface of the second plate portion 48b on the polarization beam splitter 46 side.

In the second optical system 4, the probe light L2 emitted from the fiber connector 41 passes through the lens 42 and the polarizer 43, is reflected by the mirror 44a, and enters the cell unit 10. Then, the probe light L2 emitted from the cell unit 10 is reflected by the mirror 44b, passes through the ½ wavelength plate 45, and enters the polarization beam splitter 46. Then, out of the probe light L2 incident on the polarization beam splitter 46, light in the first polarization direction passes through the optical functional surface 46a and is incident on the first light receiving element 49a, and light in the second polarization direction is reflected by the optical functional surface 46a and is incident on the second light receiving element 49b. In this manner, the first light receiving element 49a and the second light receiving element 49b receive the probe light L2 emitted from the cell unit 10 (specifically, a cell 11 to be described later).

Figure 5:
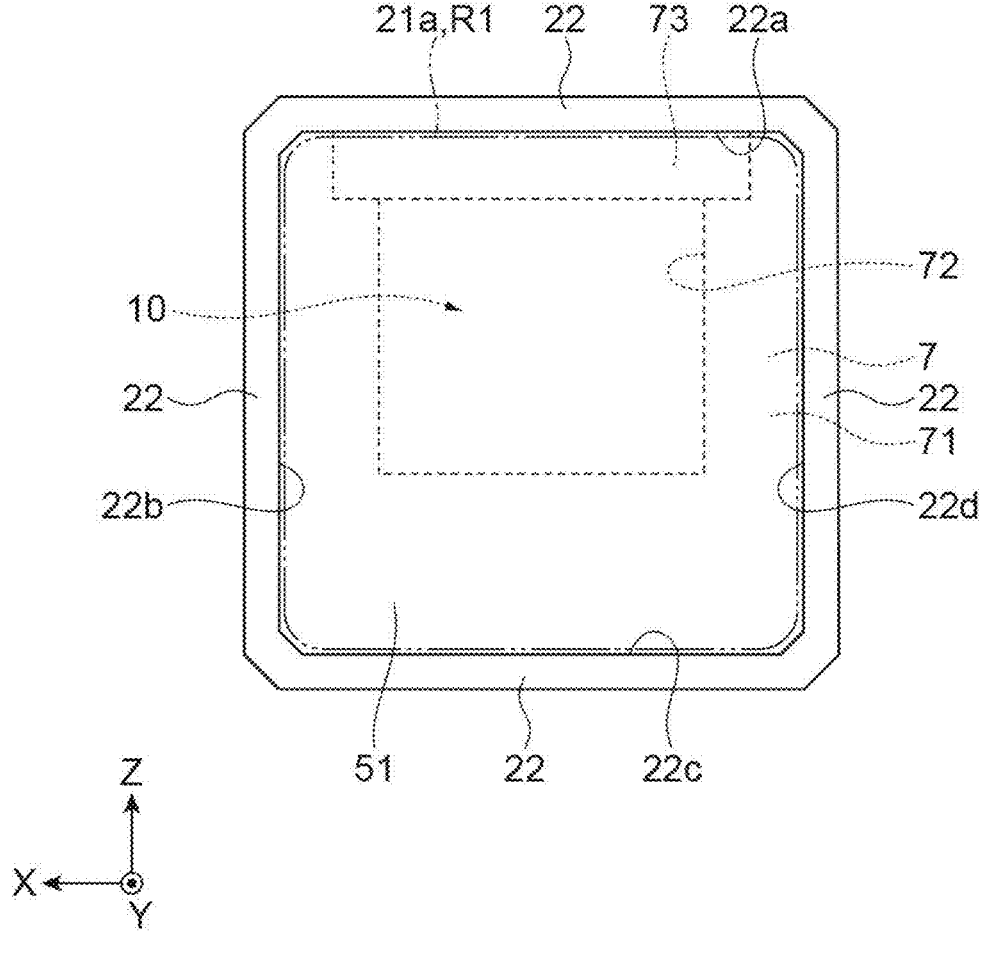
FIG. 5 is a front view of the optically pumped magnetometer module illustrated in FIG. 1.
Figure 6:
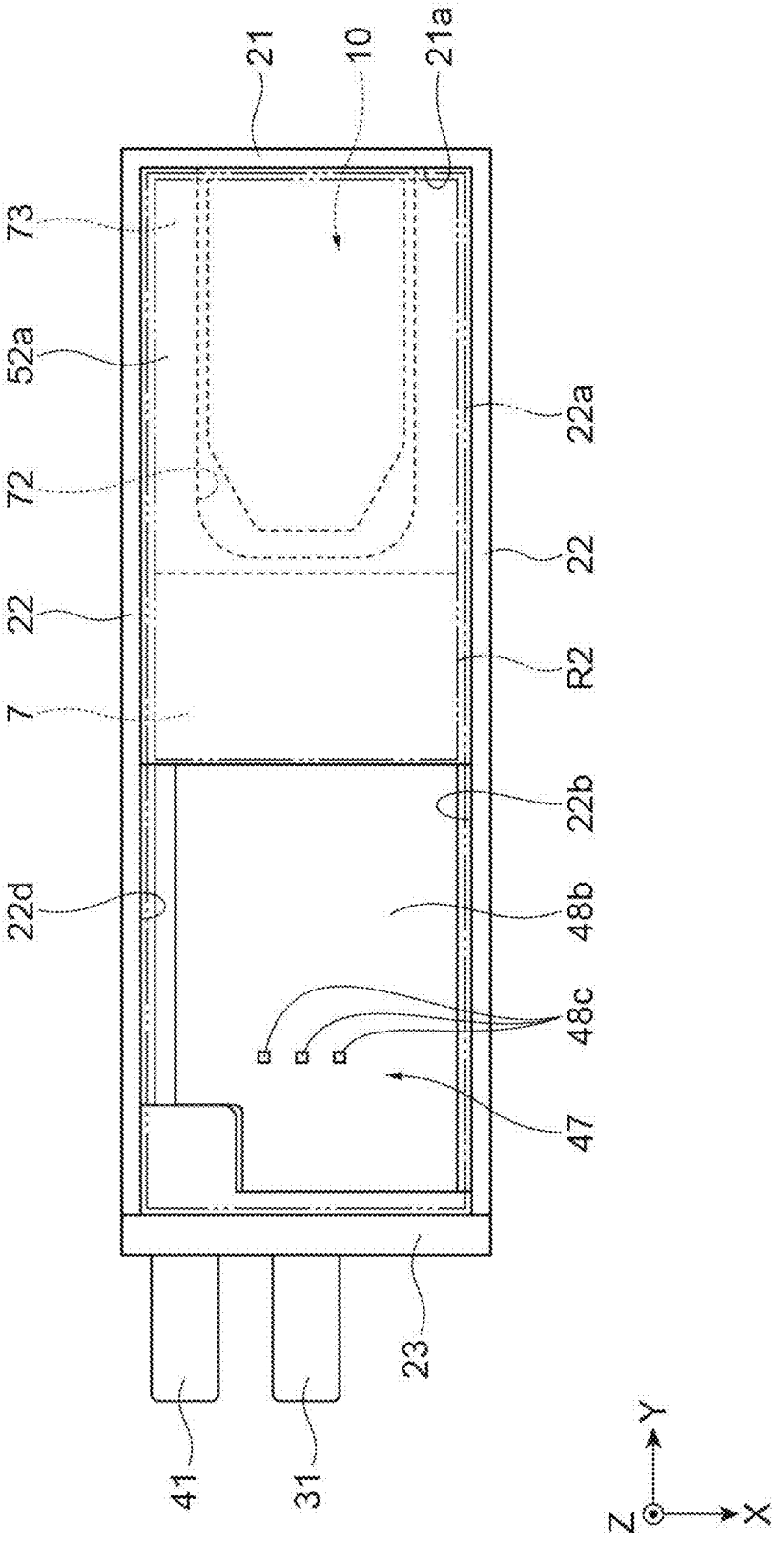
FIG. 6 is a plan view of the optically pumped magnetometer module illustrated in FIG. 1.
Figure 7:
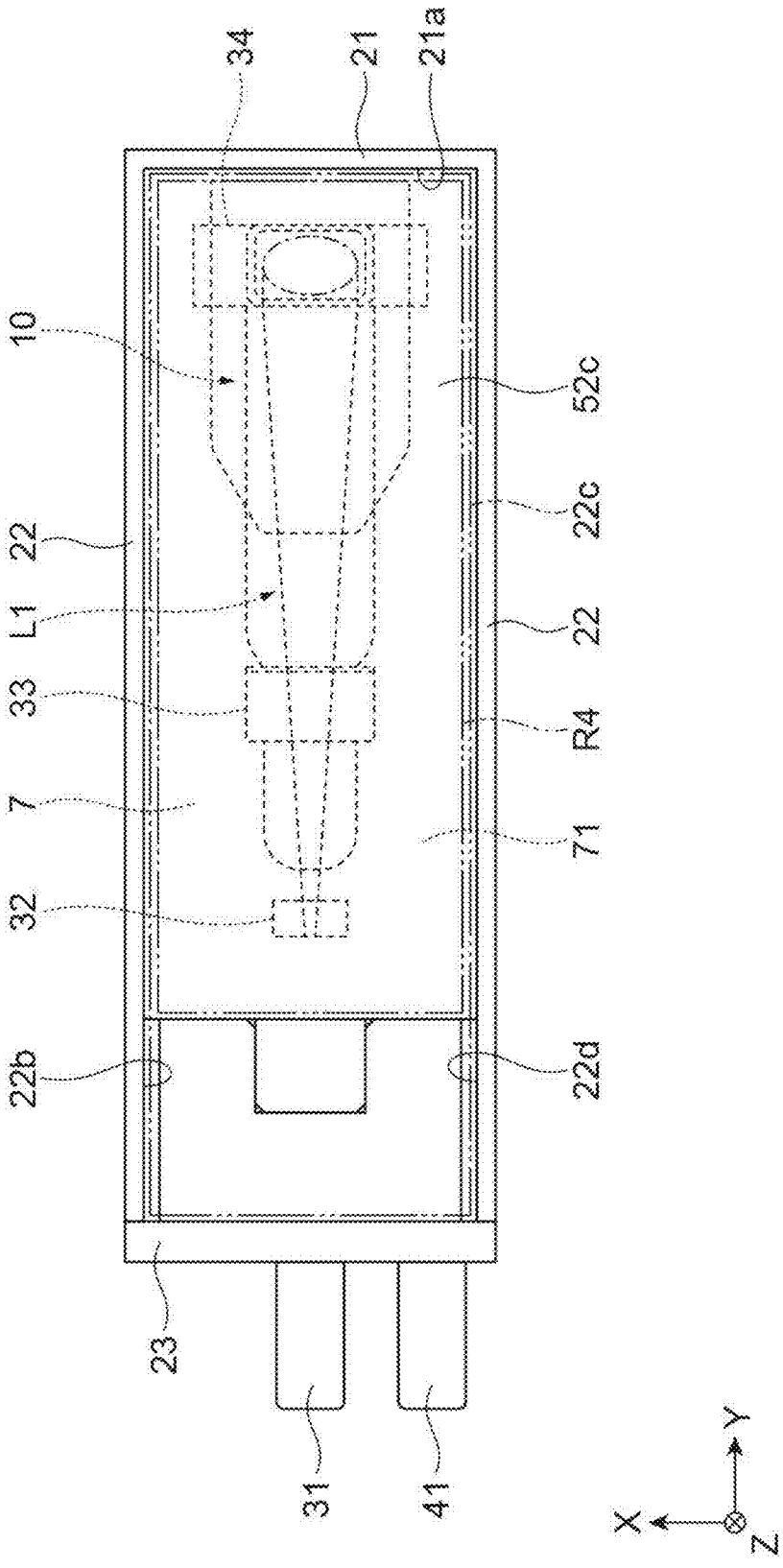
FIG. 7 is a bottom view of the optically pumped magnetometer module illustrated in FIG. 1.
Figure 8:
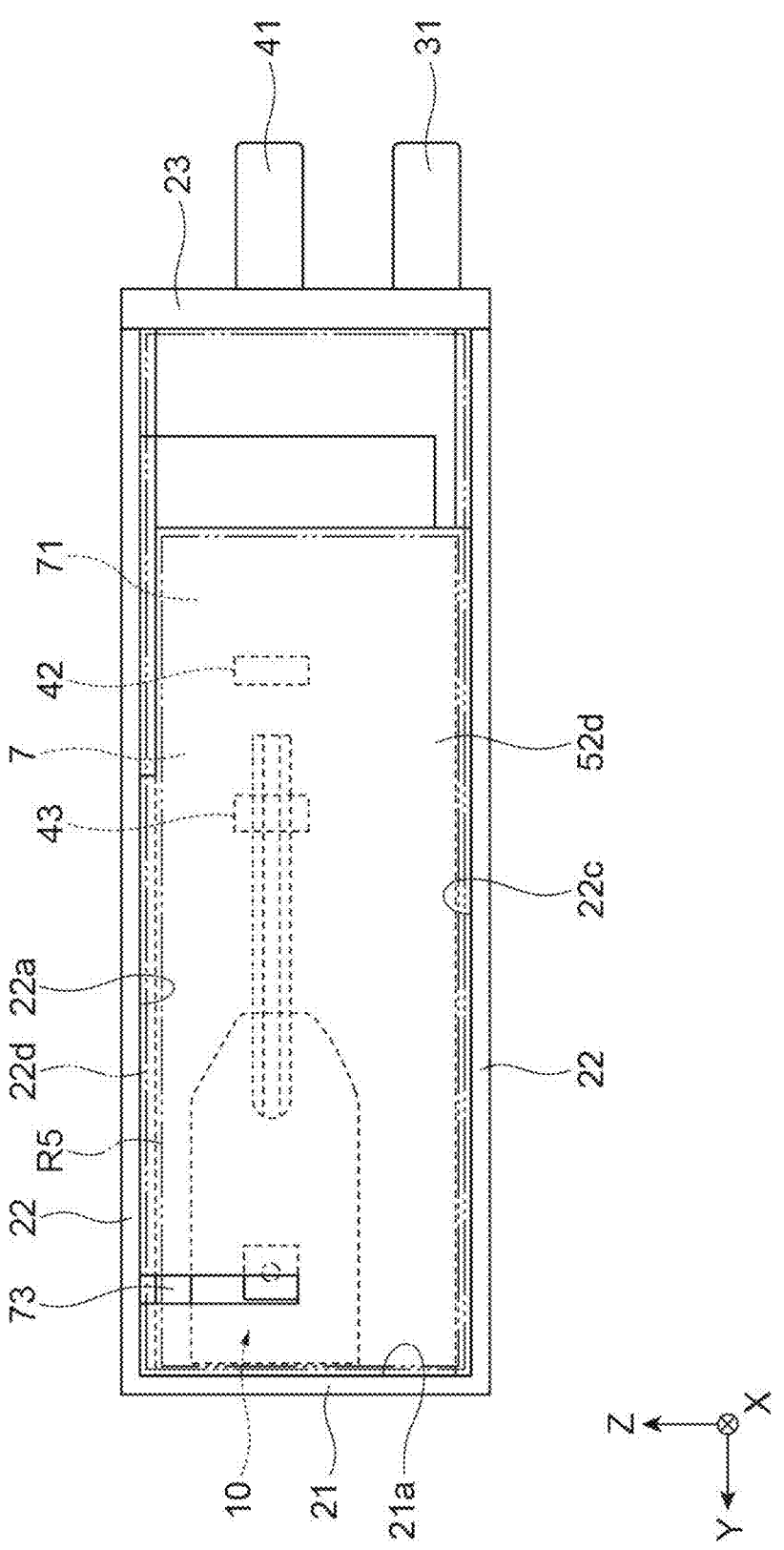
FIG. 8 is a right side view of the optically pumped magnetometer module illustrated in FIG. 1.

The heat conductive member 5, the plurality of wirings 6, and the cell unit 10 will be described with reference to FIGS. 3, 5, 6, 7, and 8. In FIG. 5, illustration of the first wall portion 21 is omitted. In FIG. 6, illustration of the second wall portion 22 having the inner surface 22a is omitted. In FIG. 7, illustration of the second wall portion 22 having the inner surface 22c is omitted. In FIG. 8, illustration of the second wall portion 22 having the inner surface 22d is omitted.

As illustrated in FIGS. 3, 5, 6, 7, and 8, the heat conductive member 5 is provided on the inner surface of the housing 2. Specifically, the heat conductive member 5 is continuously provided on the inner surface 21a of the first wall portion 21 and the inner surfaces 22a, 22b, 22c, and 22d of the plurality of second wall portions 22. The heat conductive member 5 is in contact with the inner surface 21a of the first wall portion 21 and the inner surfaces 22a, 22b, 22c, and 22d of the plurality of second wall portions 22. The heat conductive member 5 is provided in regions of the inner surfaces 22a, 22b, 22c, and 22d of the plurality of second wall portions 22 excluding a region corresponding to the light receiving unit 47. That is, the heat conductive member 5 may not be provided in the region corresponding to the light receiving unit 47. In the present embodiment, the heat conductive member 5 is a sheet-like member formed of at least a material having higher thermal conductivity than the material constituting the housing 2, and is, for example, a graphite sheet. The fact that the heat conductive member 5 is continuously provided in a certain region means that the heat conductive member 5 is provided without a gap in the region, and the region is not exposed to the outside. Note that the gap referred to here is intentionally provided by a notch, an opening, or the like, and may not include a gap that unintentionally occurs due to processing accuracy or assembly accuracy of the material. The region (in the present embodiment, regions corresponding to the first light receiving element 49a, the second light receiving element 49b, and the substrate 48) corresponding to the light receiving unit 47 means a region overlapping the light receiving unit 47 in the inner surface of the second wall portion 22 when viewed from a thickness direction of a certain second wall portion 22.

The heat conductive member 5 has a first portion 51 and a plurality of second portions 52a, 52b, 52c, and 52d. The first portion 51 is provided on the inner surface 21a of the first wall portion 21. The second portions 52a, 52b, 52c, and 52d are provided on the inner surfaces 22a, 22b, 22c, and 22d of the second wall portions 22, respectively.

As illustrated in FIG. 5, the first portion 51 is provided in a region R1 that is the entire inner surface 21a. The first portion 51 is in contact with the inner surface 21a. The second portion 52a is provided in a region of the inner surface 22a excluding a region corresponding to the light receiving unit 47. Specifically, as illustrated in FIG. 6, the second portion 52a is provided in a region R2 of the substrate 48 excluding a region facing the second plate portion 48b. The second portion 52b is provided in a region of the inner surface 22b excluding a region corresponding to the light receiving unit 47. Specifically, as illustrated in FIG. 3, the second portion 52b is provided in a region R3 excluding regions facing the substrate 48, the first light receiving element 49a, the second light receiving element 49b, and the ½ wavelength plate 45. The region R3 is a region facing an intermediate portion (part) 61 of each wiring 6 and the cell unit 10. As illustrated in FIG. 7, the second portion 52c is provided in a region R4 of the inner surface 22c, facing the polarizer 32, the lens 33, and the mirror 34. As illustrated in FIG. 8, the second portion 52d is provided in a region R5 facing the lens 42 and the polarizer 43 in the inner surface 22d.

Each wiring 6 electrically connects the cell unit 10 (specifically, each of the heater 13 and a temperature detection unit 14 to be described later) and the substrate 48. Each wiring 6 is configured by covering a metal wiring with an insulating member. As illustrated in FIG. 3, the intermediate portion 61 of each wiring 6 extends in the Y direction along the inner surface 22b of the second wall portion 22. The intermediate portion 61 of the at least one wiring 6 is in contact with the second portion 52b of the heat conductive member 5. In the present embodiment, three wirings 6 electrically connect the heater 13 and the substrate 48, and five wirings 6 electrically connect the temperature detection unit 14 and the substrate 48.

The support 7 has a support member 71, a recess 72, and a pressing plate 73. A plurality of components included in each of the first optical system 3 and the second optical system 4 are attached to the support member 71. The recess 72 is defined by the support member 71. As illustrated in FIGS. 2, 5, and 6, the recess 72 is open to the first wall portion 21 and the inner surface 22a. The pressing plate 73 is screwed to the support member 71. The support 7 positions the cell unit 10 at a predetermined position in the housing 2. Specifically, the cell unit 10 is positioned in the X direction and the Y direction by the recess 72 and the first wall portion 21. The cell unit 10 is positioned in the Z direction by the bottom surface of the recess 72 and the pressing plate 73.

[Configuration of Cell Unit]

Figure 9:
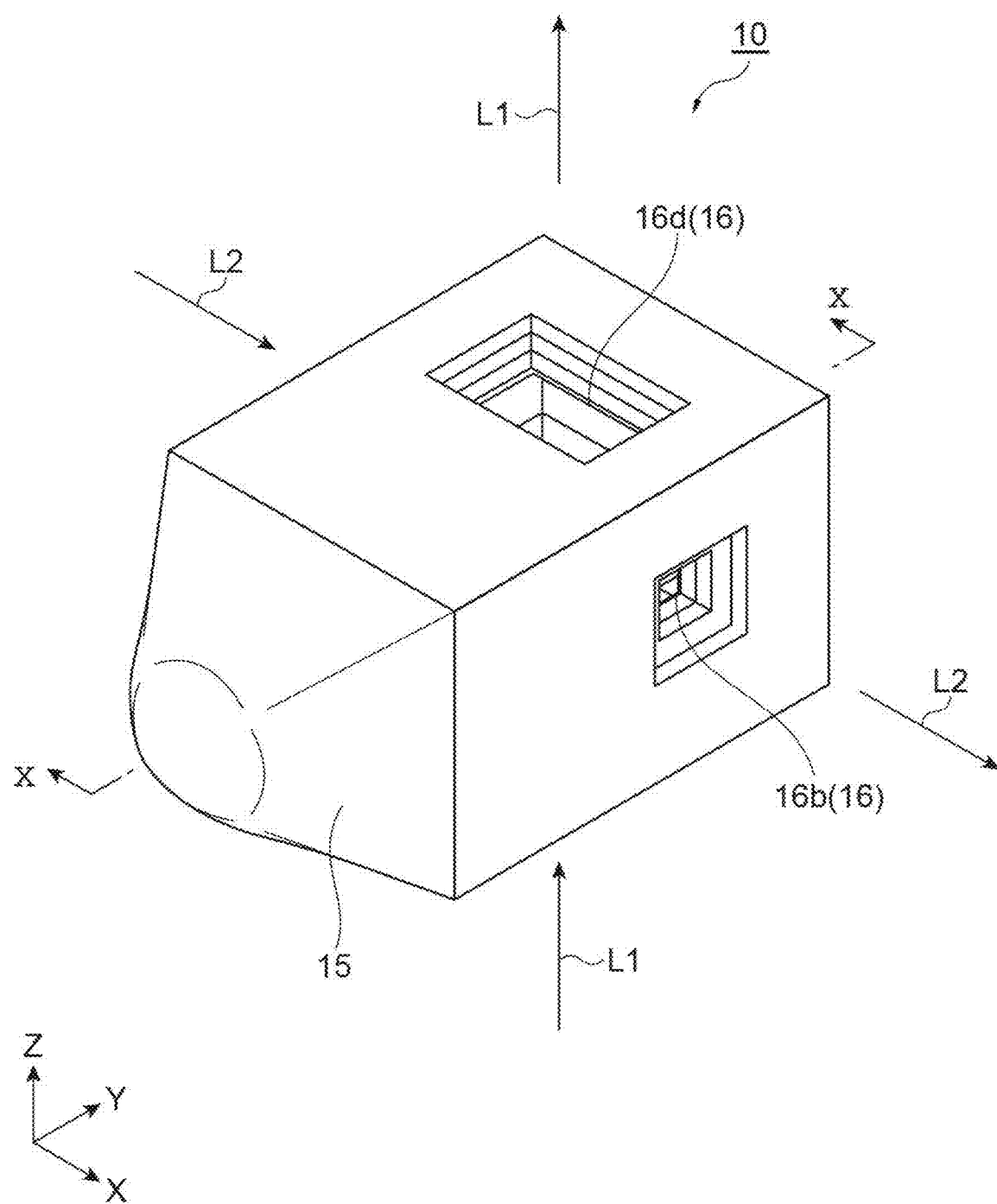
FIG. 9 is a perspective view of a cell unit of the optically pumped magnetometer module illustrated in FIG. 1.
Figure 10:
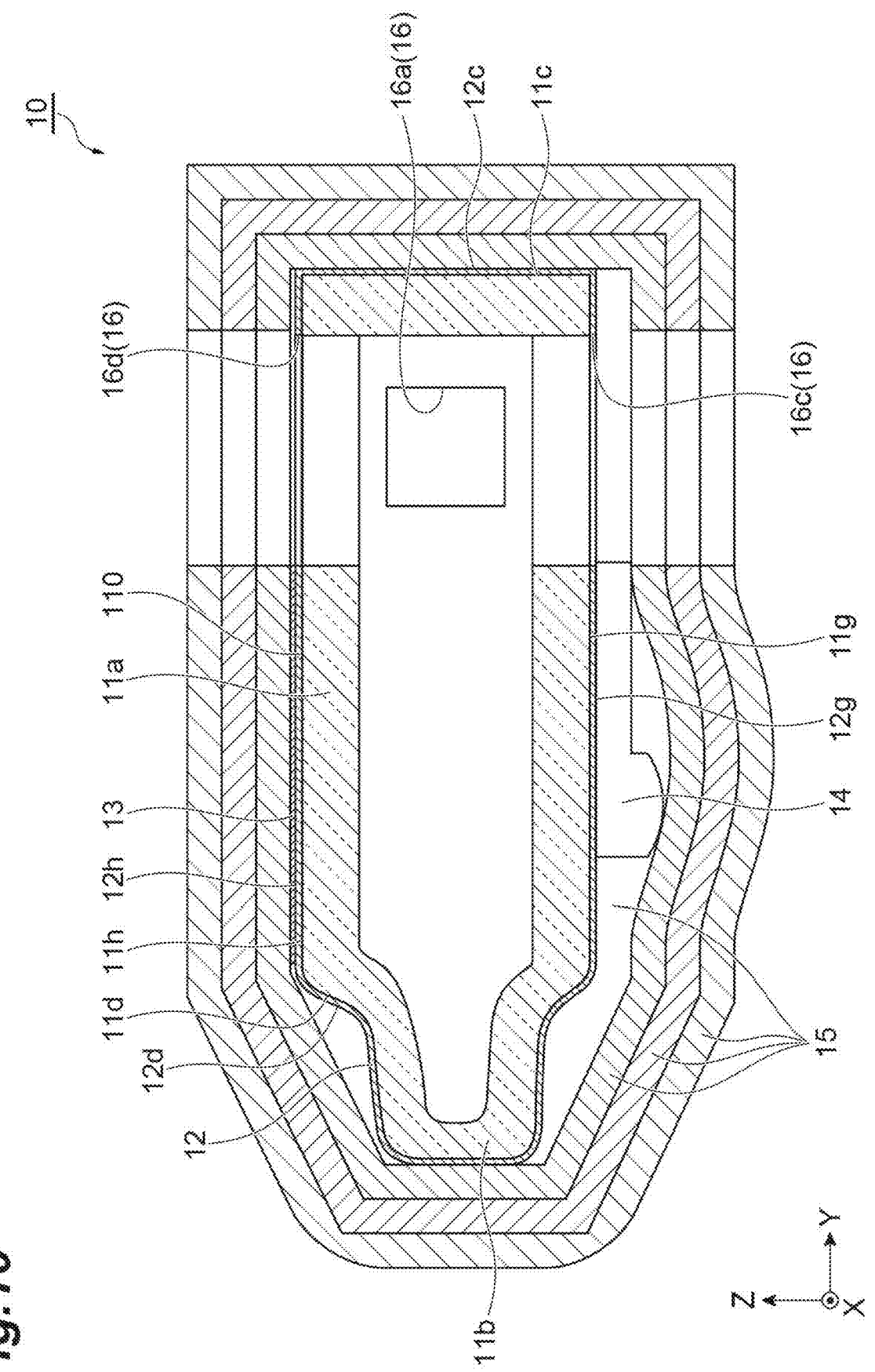
FIG. 10 is a cross-sectional view of the cell unit taken along line X-X illustrated in FIG. 9.

As illustrated in FIGS. 9 and 10, the cell unit 10 has, for example, a rectangular parallelepiped shape. The cell unit 10 has a cell 11, a heat conductive member (first heat conductive member) 12, a heater 13, a temperature detection unit 14, and heat insulating members 15. The cell unit 10 is a portion where the pump light L1 enters and exits, and the probe light L2 enters and exits.

The cell 11 includes a main body portion 11a and a protrusion 11b. The cell 11 is formed of, for example, a translucent material such as glass. An alkali metal and an inert gas are enclosed in the cell 11. The alkali metal enclosed in the cell 11 is, for example, potassium, rubidium, or potassium and rubidium. The inert gas enclosed in the cell 11 is, for example, nitrogen gas or helium gas. The protrusion 11b is a tubular body communicating with the inside of the main body portion 11a, and is a portion sealed after being used as a passage for introducing the alkali metal and the inert gas.

Figure 11:
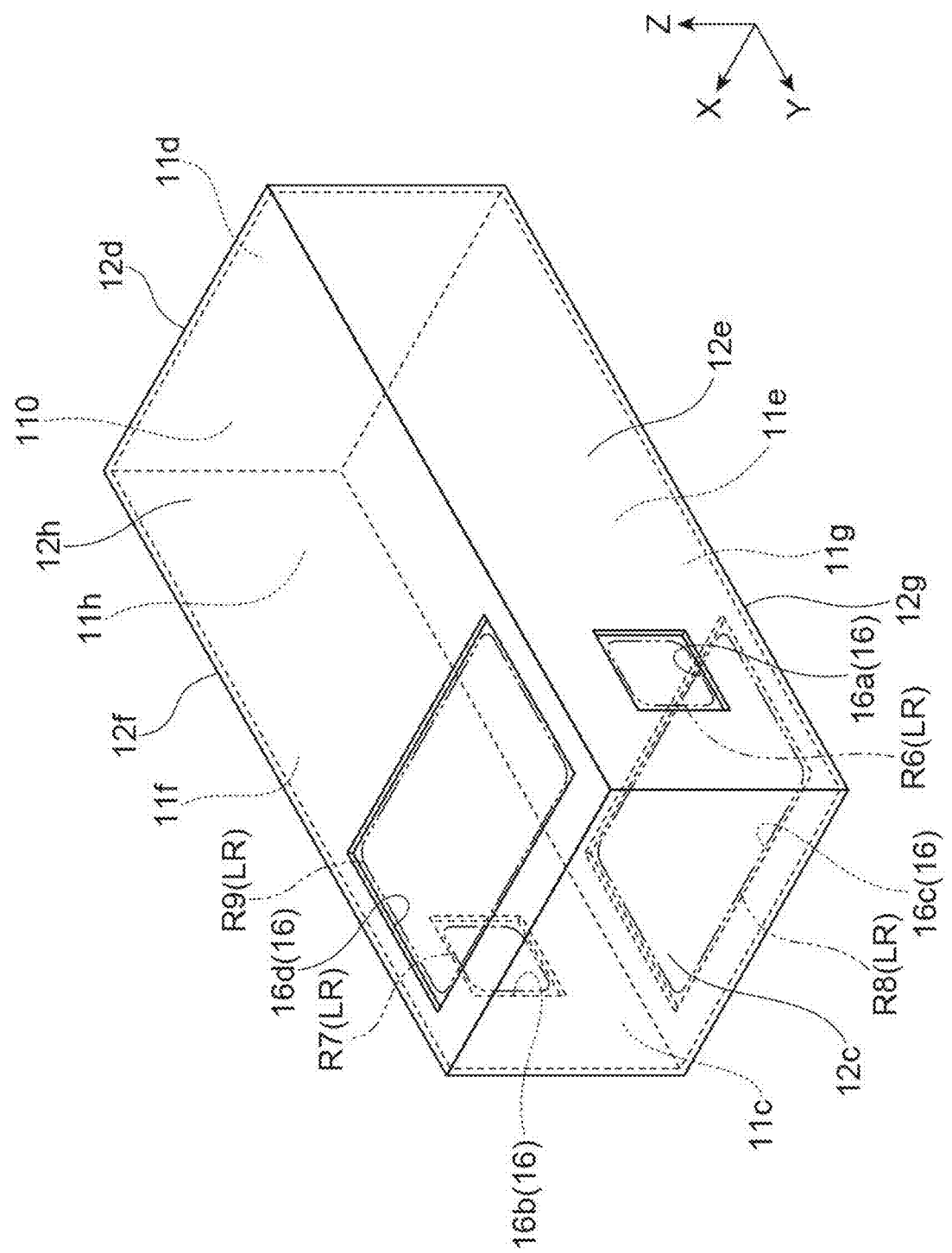
FIG. 11 is a perspective view of a cell of the cell unit and a heat conductive member illustrated in FIG. 9.
Figure 12:
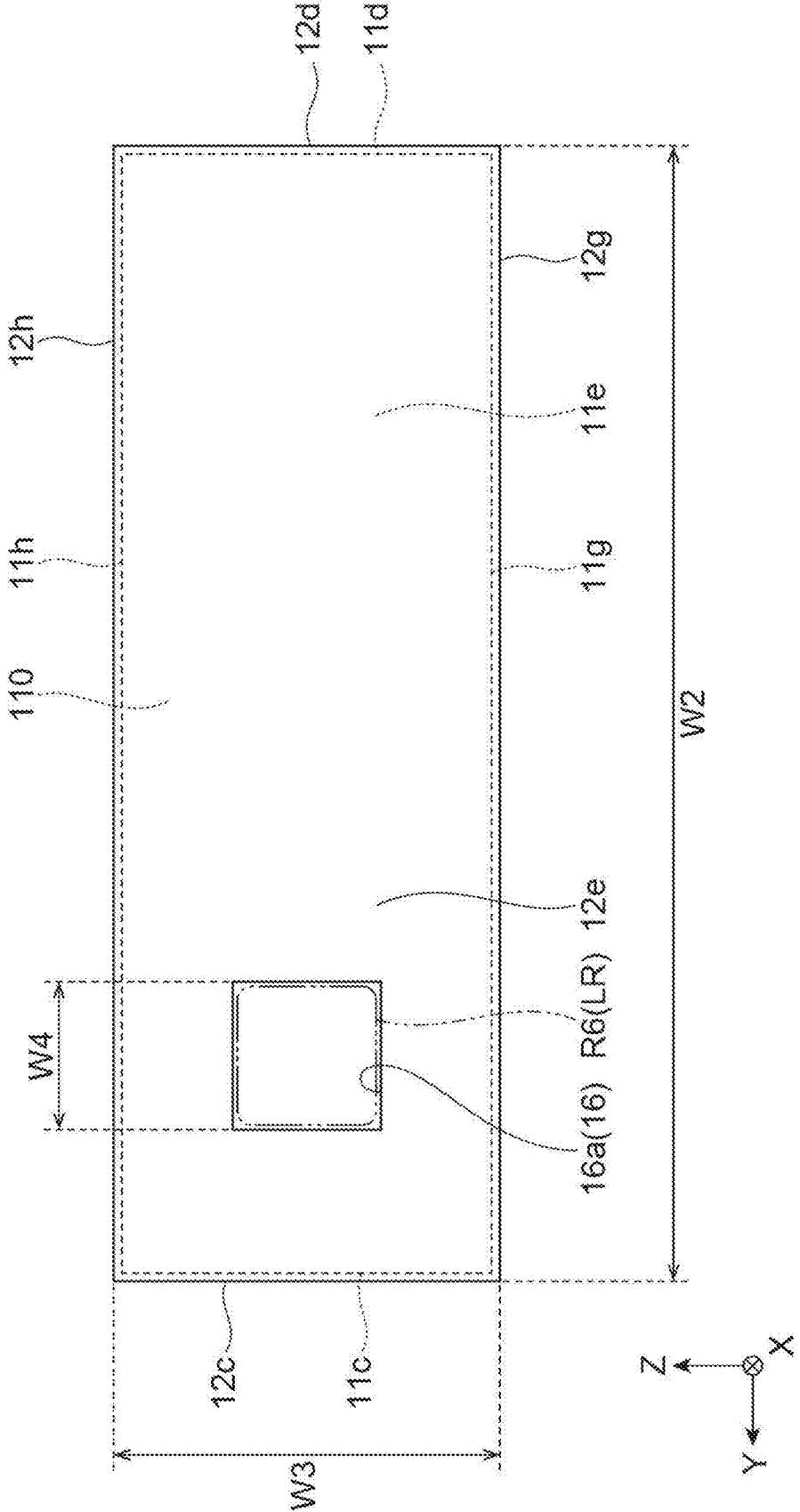
FIG. 12 is a right side view of the cell and the heat conductive member illustrated in FIG. 11.
Figure 13:
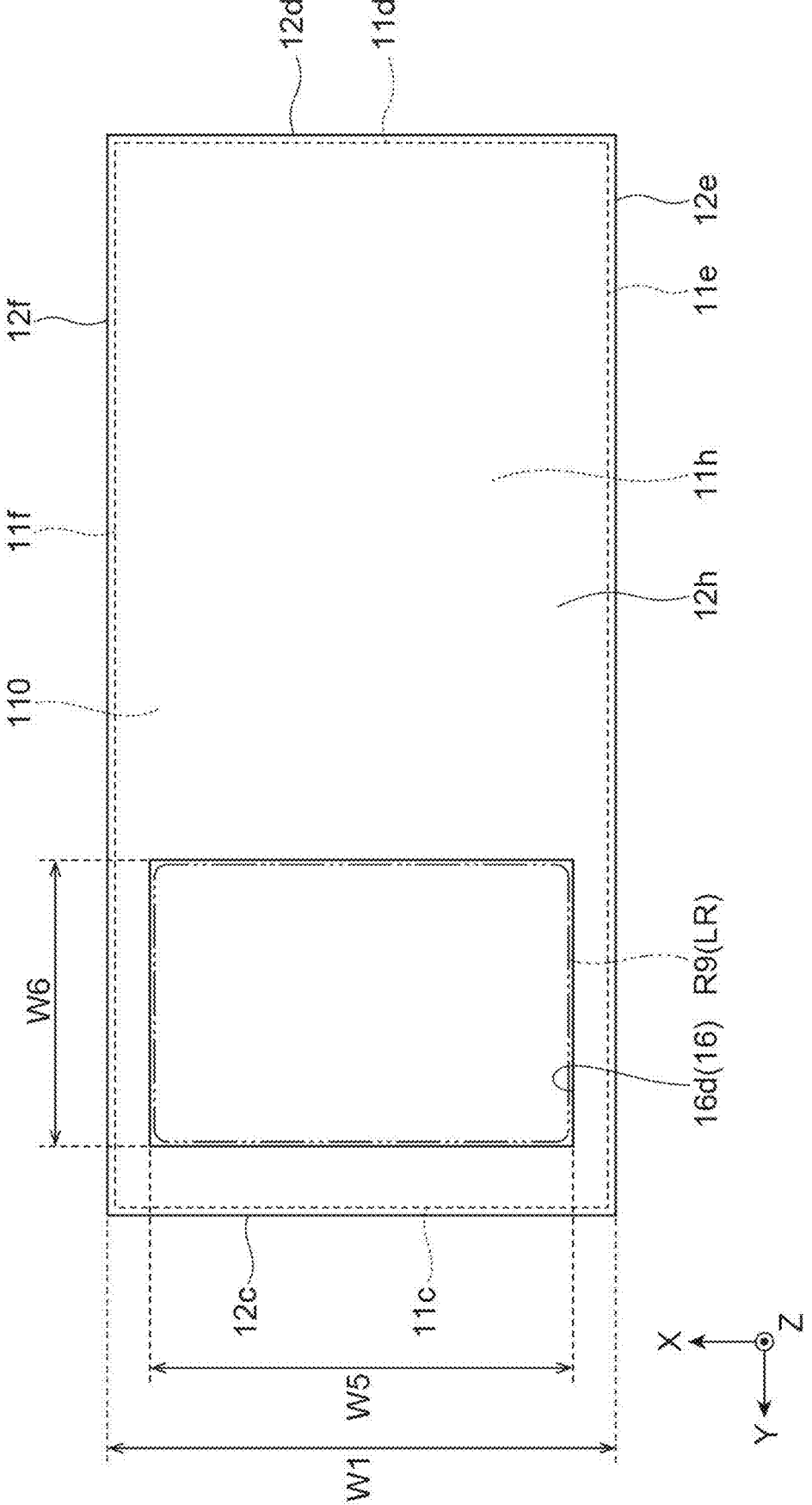
FIG. 13 is a plan view of the cell and the heat conductive member illustrated in FIG. 11.

The main body portion 11a has light-passing regions LR that are portions where the pump light L1 enters and exits, and the probe light L2 enters and exits. That is, the main body portion 11a has the light-passing regions LR through which at least one of the pump light L1 and the probe light L2 passes. As illustrated in FIGS. 11 to 13, the main body portion 11a has, for example, a rectangular parallelepiped shape. A width W1 of the main body portion 11a in the X direction is smaller than a width W2 of the main body portion 11a in the Y direction. A width W3 of the main body portion 11a in the Z direction is smaller than the width W2 of the main body portion 11a in the Y direction. The width W1 of the main body portion 11a in the X direction is larger than the width W3 of the main body portion 11a in the Z direction. As an example, the width W1 and the width W2 are about several mm, and the width W3 is about ten and several mm. In FIGS. 11, 12, and 13, illustration of the protrusion 11b is omitted. The light-passing regions LR include an incidence region R6 of the probe light L2, an emission region R7 of the probe light L2 facing the incidence region R6 of the probe light L2 in the X direction, an incidence region R8 of the pump light L1, and an emission region R9 of the pump light L1 facing the incidence region R8 of the pump light L1 in the Z direction.

The main body portion 11a has an outer surface 110 including a first surface 11c, a second surface 11d, a third surface 11e, a fourth surface 11f, a fifth surface 11g, and a sixth surface 11h. The first surface 11c and the second surface 11d face each other in the Y direction. The third surface 11e and the fourth surface 11f face each other in the X direction. The fifth surface 11g and the sixth surface 11h face each other in the Z direction. The protrusion 11b is located on the second surface 11d.

On the third surface 11e, the incidence region R6 of the probe light L2 is formed as the light-passing region LR. The probe light L2 enters the inside of the cell 11 via the incidence region R6. The incidence region R6 is located on the first surface 11c side with respect to the center of the third surface 11e in the Y direction. The incidence region R6 has, for example, a square shape. A width W4 of one side of the incidence region R6 is, for example, about several mm.

On the fourth surface 11f, the emission region R7 of the probe light L2 is formed as the light-passing region LR. The probe light L2 is emitted from the inside of the cell 11 via the emission region R7. The emission region R7 is located on the first surface 11c side with respect to the center of the fourth surface 11f in the Y direction. The emission region R7 faces the incidence region R6 in the X direction. The emission region R7 has, for example, a square shape. The width W4 of one side of the emission region R7 is, for example, about several mm.

On the fifth surface 11g, the incidence region R8 of the pump light L1 is formed as the light-passing region LR. The pump light L1 enters the inside of the cell 11 via the incidence region R8. The incidence region R8 is located on the first surface 11c side with respect to the center of the fifth surface 11g in the Y direction. The incidence region R8 has, for example, a rectangular shape with the X direction as the longitudinal direction. A width W5 of the incidence region R8 in the X direction is larger than a width W6 of the incidence region R8 in the Y direction. The width W5 and the width W6 are, for example, about several mm. The direction in which the pump light L1 enters the incidence region R8 of the pump light L1 is the Z direction.

On the sixth surface 11h, the emission region R9 of the pump light L1 is formed as the light-passing region LR. The pump light L1 is emitted from the inside of the cell 11 via the emission region R9. The emission region R9 is located on the first surface 11c side with respect to the center of the sixth surface 11h in the Y direction. The emission region R9 faces the incidence region R8 in the Z direction. The emission region R9 has, for example, a rectangular shape with the X direction as the longitudinal direction. A width W5 of the emission region R9 in the X direction is larger than a width W6 of the emission region R9 in the Y direction. The width W5 and the width W6 are, for example, about several mm. The pump light L1 emitted from the inside of the cell 11 via the emission region R9 enters the pressing plate 73 (see FIG. 2), and is reflected or absorbed by the pressing plate 73.

As described above, the width W6 of each of the incidence region R8 and the emission region R9 of the pump light L1 in the Y direction is larger than the width W4 of each of the incidence region R6 and the emission region R7 of the probe light L2 in the Y direction. An area of each of the incidence region R8 and the emission region R9 of the pump light L1 is larger than an area of each of the incidence region R6 and the emission region R7 of the probe light L2.

The heat conductive member 12 covers the cell 11. The heat conductive member 12 is continuously provided over the entire region of the outer surface 110 of the main body portion 11a excluding the incidence region R6 of the probe light L2, the emission region R7 of the probe light L2, the incidence region R8 of the pump light L1, and the emission region R9 of the pump light L1, which are the light-passing regions LR, and is in contact with the regions. That is, the heat conductive member 12 is continuously provided over the entire region of the outer surface 110 of the main body portion 11a excluding the light-passing regions LR. In the present embodiment, the heat conductive member 12 is formed of, for example, a material having thermal conductivity higher than that of at least the material constituting the cell 11. In the present embodiment, the heat conductive member 12 is an integrally formed sheet-like member, and is attached to the outer surface 110 of the cell 11. In the present embodiment, the heat conductive member 12 is, for example, a graphite sheet. As an example, the heat conductive member 12 is formed to have the same shape as the development view of the outer surface 110, and is attached to the outer surface 110. Note that the fact that the heat conductive member 12 is continuously provided in a certain region means that the heat conductive member 12 is provided without a gap in a certain region, and the region is not exposed to the outside. Note that the gap referred to here is intentionally provided by a notch, an opening, or the like, and may not include a gap that unintentionally occurs due to processing accuracy or assembly accuracy of the material.

The heat conductive member 12 includes a first surface 12c, a second surface 12d, a third surface 12e, a fourth surface 12f, a fifth surface 12g, and a sixth surface 12h. The first surface 12c, the second surface 12d, the third surface 12e, the fourth surface 12f, the fifth surface 12g, and the sixth surface 12h are in contact with each other on adjacent surfaces, and are thermally connected to each other. The first surface 12c is provided on the first surface 11c and is in contact with the first surface 11c. The second surface 12d is provided on the second surface 11d and is in contact with the second surface 11d. The second surface 12d also covers a part of the protrusion 11b. In addition, the heat conductive member 12 has openings 16 corresponding to the light-passing regions LR. The openings 16 include an incidence opening 16a of the probe light L2, an emission opening 16b of the probe light L2, an incidence opening 16c of the pump light L1, and an emission opening 16d of the pump light L1.

The third surface 12e is provided over the entire region of the third surface 11e excluding the incidence region R6 of the probe light L2. On the third surface 12e, the incidence opening 16a of the probe light L2 is formed as the opening 16. The incidence opening 16a of the probe light L2 corresponds to the incidence region R6 of the probe light L2. In other words, the incidence region R6 is a region defined by the incidence opening 16a and is a region exposed to the outside in the incidence opening 16a. The third surface 12e is in contact with the third surface 11e.

The fourth surface 12f is provided over the entire region of the fourth surface 11f excluding the emission region R7 of the probe light L2. On the fourth surface 12f, the emission opening 16b of the probe light L2 is formed as the opening 16. The emission opening 16b of the probe light L2 corresponds to the emission region R7 of the probe light L2. In other words, the emission region R7 is a region defined by the emission opening 16b and is a region exposed to the outside in the emission opening 16b. The fourth surface 12f is in contact with the fourth surface 11f.

The fifth surface 12g is provided over the entire region of the fifth surface 11g excluding the incidence region R8 of the pump light L1. On the fifth surface 12g, the incidence opening 16c of the pump light L1 is formed as the opening 16. The incidence opening 16c of the pump light L1 corresponds to the incidence region R8 of the pump light L1. In other words, the incidence region R8 is a region defined by the incidence opening 16c, and is a region exposed to the outside from the incidence opening 16c. The fifth surface 12g is in contact with the fifth surface 11g.

The sixth surface 12h is provided over the entire region of the sixth surface 11h excluding the emission region R9 of the pump light L1. On the sixth surface 12h, the emission opening 16d of the pump light L1 is formed as the opening 16. The emission opening 16d of the pump light L1 corresponds to the emission region R9 of the pump light L1. In other words, the emission region R9 is a region defined by the emission opening 16d and is a region exposed to the outside in the emission opening 16d. The sixth surface 12h is in contact with the sixth surface 11h.

As illustrated in FIG. 10, the heater 13 is provided on the heat conductive member 12 and is in contact with the heat conductive member 12. In the present embodiment, the heater 13 is provided on the sixth surface 12h, and is located on the second surface 11d side with respect to the center of the sixth surface 11h in the Y direction. The heater 13 includes a metal wire that generates heat by energization. As an example, the heater 13 includes a titanium wire and is attached to the sixth surface 12h by a polyimide tape. The metal wire of the heater 13 preferably has a high resistance value in order to obtain a high amount of heat generation with a low current value. The metal wire of the heater 13 is, for example, a titanium wire having a resistance value of about 100Ω.

The temperature detection unit 14 is provided on the heat conductive member 12 and is in contact with the heat conductive member 12. In the present embodiment, the temperature detection unit 14 is provided on the fifth surface 12g and is in direct contact with the fifth surface 12g. The temperature detection unit 14 is located on the second surface 11d side with respect to the center of the fifth surface 11g in the Y direction. The temperature detection unit 14 is an element for measuring the temperature of the cell 11. The temperature detection unit 14 is, for example, a temperature measurement resistor, and is Pt 100 as an example.

As illustrated in FIGS. 9 and 10, the heat insulating members 15 cover the heat conductive member 12, the heater 13, and the temperature detection unit 14. The heat insulating members 15 are continuously provided over the entire portion of the heat conductive member 12 excluding the incidence opening 16a of the probe light L2, the emission opening 16b of the probe light L2, the incidence opening 16c of the pump light L1, and the emission opening 16d of the pump light L1. That is, the heat insulating members 15 are continuously provided over the entire region of the heat conductive member 12 excluding the openings 16. In the present embodiment, the heat insulating members 15 are each of a plurality of (for example, three) sheet-shaped members. Each sheet-shaped member is formed of a material having a heat insulating property higher than at least the heat conductive member 12, and is formed of, for example, heat insulating paper made of silica aerogel and synthetic fibers. Note that the fact that the heat insulating members 15 are continuously provided in a certain region means that the heat insulating members 15 are provided without a gap in a certain region, and the region is not exposed to the outside. Note that the gap referred to here is intentionally provided by a notch, an opening, or the like, and may not include a gap that unintentionally occurs due to processing accuracy or assembly accuracy of the material.

Figure 4:
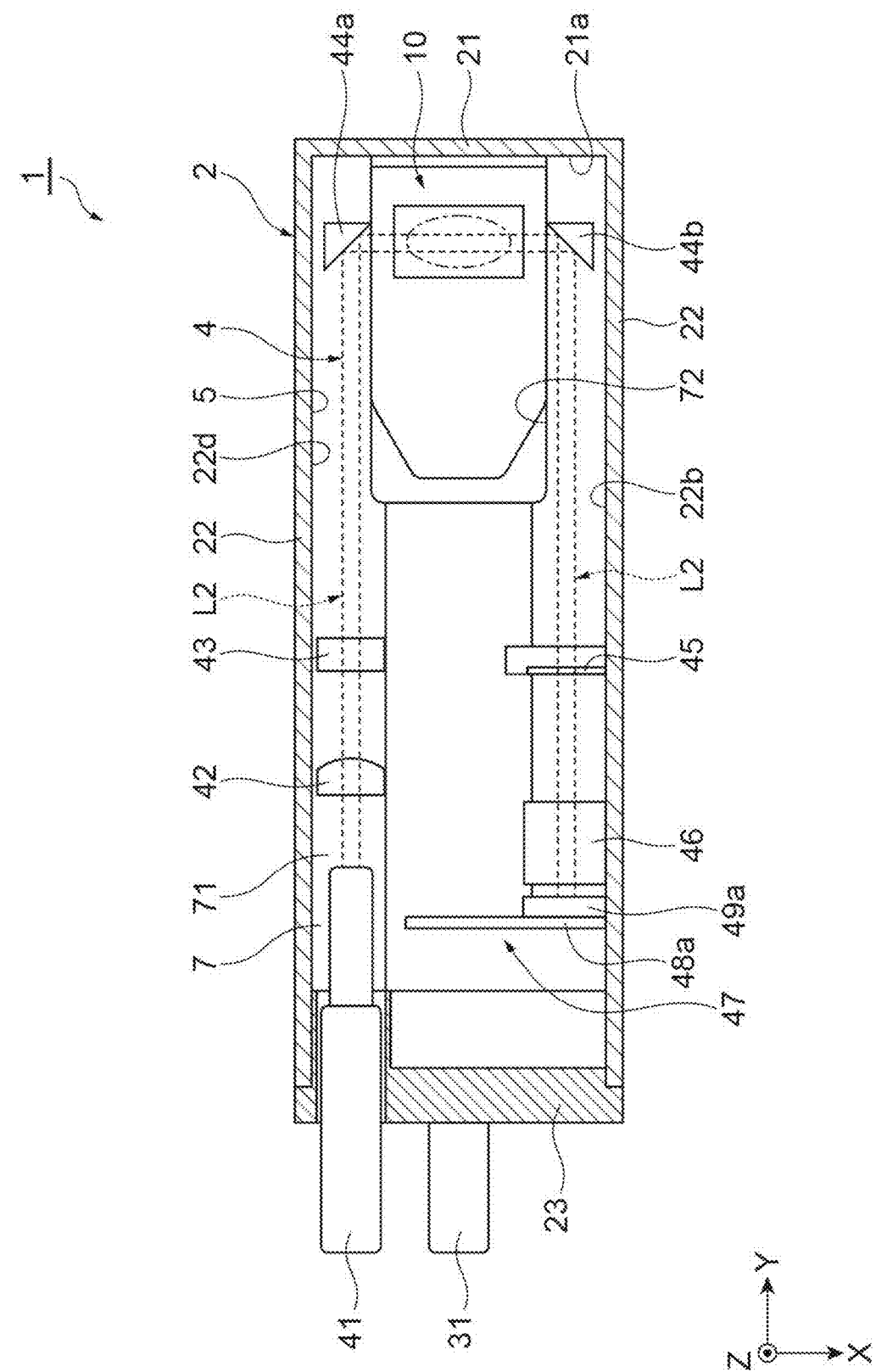
FIG. 4 is a cross-sectional view of the optically pumped magnetometer module taken along line IV-IV illustrated in FIG. 1.

As illustrated in FIGS. 2 and 4, the cell unit 10 configured as described above is in contact with the heat conductive member 5 on the inner surface 21a of the first wall portion 21. That is, the cell unit 10 is disposed in the housing 2 such that no space is formed between the first wall portion 21 and the cell unit 10. The cell unit 10 is positioned by the support 7 such that such a state is realized and maintained.

[Operation of Optically Pumped Magnetometer Module]

The optically pumped magnetometer module 1 is disposed such that the first wall portion 21 is located on the measurement target side (that is, focusing on the cell unit 10, the first surface 11c of the main body portion 11a of the cell 11 is positioned on the measurement target side). In this state, the alkali metal enclosed in the cell 11 is heated by the heater 13 via the heat conductive member 12, such that vapor atoms of the alkali metal (alkali metal vapor) are obtained. In the optically pumped magnetometer module 1, the pump light L1 is guided to the incidence region R8 of the pump light L1 of the cell 11 by the first optical system 3. Next, the pump light L1 passes through the inside of the cell 11 from the incidence region R8 to the emission region R9. At this time, the alkali metal vapor inside the cell 11 is brought into a spin-polarized state by optical pumping by the pump light L1. Subsequently, the probe light L2 is linearly polarized in the first polarization direction by the polarizer 43 of the second optical system 4. Subsequently, the probe light L2 is guided to the incidence region R6 of the probe light of the cell 11. Subsequently, the probe light L2 passes through the inside of the cell 11 from the incidence region R6 to the emission region R7. At this time, the probe light L2 passes through the alkali metal vapor inside the cell 11. Here, since the spin-polarized state of the alkali metal vapor changes under the influence of the magnetic field of the measurement target, the polarization direction of the probe light L2 having passed through the alkali metal vapor is changed so as to be inclined from the first polarization direction toward the second polarization direction. Then, the intensity of light of a first polarization direction component in the probe light L2 is detected by the first light receiving element 49a. The intensity of light of a second polarization direction component in the probe light L2 is detected by the second light receiving element 49b. As a result, a difference between the light intensities of the polarization direction components in the probe light L2 is detected. Then, the optically pumped magnetometer module 1 detects the spin-polarized state of the alkali metal vapor based on the difference. Finally, the optically pumped magnetometer module 1 detects the magnetic field in the measurement target from the spin-polarized state of the alkali metal vapor.

Actions and Effects

In the optically pumped magnetometer module 1, the heat conductive member 12 is continuously provided over the entire region excluding the incidence region R8 of the pump light L1, the emission region R9 of the pump light L1, the incidence region R6 of the probe light L2, and the emission region R7 of the probe light L2, which are the light-passing regions LR, on the outer surface 110 of the main body portion 11a. Specifically, the heat conductive member 12 is provided without a gap in a certain region, and the region is not exposed to the outside. The heat conductive member 12 has the first surface 12c, the second surface 12d, the third surface 12e, the fourth surface 12f, the fifth surface 12g, and the sixth surface 12h, and these surfaces are in contact with each other on adjacent surfaces, and are thermally connected to each other. As a result, the heat generated from the heater 13 is conducted to the entire outer surface 110 of the cell 11 via each surface of the heat conductive member 12, such that the cell 11 can be uniformly heated. Therefore, it is possible to provide an optically pumped magnetometer module 1 capable of uniformly heating the cell 11. In the optically pumped magnetometer module 1, the cell 11 is uniformly heated, such that the measurement sensitivity of the magnetic field and the stability of the measurement are improved. Furthermore, uniform heating of the cell 11 reduces the amount of energy required to heat the lowest temperature portion of the cell 11 to a target temperature. As a result, since the power consumption in the optically pumped magnetometer module 1 is suppressed, noise when measuring the magnetic field is reduced.

Here, a cell unit of an example and a cell unit of a comparative example will be described. The cell unit of the example has the same configuration as the cell unit 10 described above. The cell unit of the comparative example is different from the cell unit of the example only in that the cell unit of the comparative example does not have a configuration corresponding to the heat conductive member 12. In the cell unit of the comparative example, the maximum value of the temperature was twice as high as the minimum value of the temperature on the outer surface of the cell. On the other hand, in the cell unit of the example, the maximum value of the temperature was 1.01 times or less the minimum value of the temperature on the outer surface of the cell.

In the optically pumped magnetometer module 1, the heat insulating members 15 are continuously provided over the entire portion of the heat conductive member 12 excluding the incidence opening 16c of the pump light L1, the emission opening 16d of the pump light L1, the incidence opening 16a of the probe light L2, and the emission opening 16b of the probe light L2, which are the openings 16 corresponding to the light-passing regions LR. This suppresses the release of the heat to the outside of the cell unit 10. As a result, the cell 11 can be heated more efficiently, and a temperature rise of the housing 2 can be suppressed.

In the optically pumped magnetometer module 1, the cell unit 10 is disposed in the housing 2 such that no space is formed between the first wall portion 21 of the housing 2 and the cell unit 10. As a result, for example, when the outer surface of the first wall portion 21 is brought close to the measurement target, a distance between the cell unit 10 and the measurement target becomes smaller. As a result, the magnetic field in the measurement target can be measured with higher sensitivity.

In the optically pumped magnetometer module 1, the heat conductive member 5 is continuously provided over the inner surface 21a of the first wall portion 21 and the inner surfaces 22a, 22b, 22c, and 22d of the plurality of second wall portions 22. The cell unit 10 is in contact with the heat conductive member 5 on the inner surface 21a of the first wall portion 21. As a result, the heat generated in the cell unit 10 is conducted to the entire heat conductive member 5. More specifically, after conduction to the first portion 51, conduction to the plurality of second portions 52a, 52b, 52c, and 52d is performed. As a result, when the outer surface of the optically pumped magnetometer module 1 (particularly the first wall portion 21) is brought close to the measurement target, it is possible to suppress an adverse effect on the measurement target due to a locally high temperature of the housing 2 (particularly the first wall portion 21).

Here, an optically pumped magnetometer module of an example and an optically pumped magnetometer module of a comparative example will be described. The optically pumped magnetometer module of the example has the same configuration as the optically pumped magnetometer module 1 described above. The optically pumped magnetometer module of the comparative example is different from the optically pumped magnetometer module of the example only in that the optically pumped magnetometer module does not have a configuration corresponding to the heat conductive member 5. In the optically pumped magnetometer module of the comparative example, the temperature of the first wall portion was 90° C. or higher. On the other hand, in the optically pumped magnetometer module of the example, the temperature of the first wall portion was about 50° C.

In the optically pumped magnetometer module 1, the heat conductive member 5 is not provided in regions of the inner surfaces 22a, 22b, 22c, and 22d of the second wall portion 22, the regions corresponding to the light receiving unit 47 having the first light receiving element 49a, the second light receiving element 49b, and the substrate 48, but is provided in the regions R1, R2, R3, R4, and R5 excluding the regions. As a result, the light receiving unit 47 is prevented from being affected by heat conduction from the heat conductive member 5, such that the heat conducted to the heat conductive member 5 is prevented from being conducted to the light receiving unit 47. Therefore, a temperature rise of the first light receiving element 49a, the second light receiving element 49b, and the substrate 48 is suppressed. As a result, an increase in the dark current in the first light receiving element 49a and the second light receiving element 49b, thermal deformation of the substrate 48, and damage of the weak heat component mounted on the substrate 48 are suppressed, such that it is possible to avoid a decrease in the SN ratio in the signals from the first light receiving element 49a and the second light receiving element 49b.

In the optically pumped magnetometer module 1, the intermediate portion 61 of at least one wiring 6 is in contact with the second portion 52b of the heat conductive member 5. As a result, when the heat generated in the heater 13 and the heat conducted to the temperature detection unit 14 are conducted to the intermediate portion 61 of each wiring 6, the heat is released to the outside of the housing 2 via the heat conductive member 5. As a result, the conduction of the heat from each wiring 6 to the substrate 48 is suppressed, such that the temperature rise of the first light receiving element 49a and the second light receiving element 49b mounted on the substrate 48 is also suppressed. Therefore, an increase in the dark current in the first light receiving element 49a and the second light receiving element 49b, thermal deformation of the substrate 48, and damage of the weak heat component mounted on the substrate 48 are suppressed, such that it is possible to avoid a decrease in the SN ratio in the signals from the first light receiving element 49a and the second light receiving element 49b.

In the optically pumped magnetometer module 1, the incidence region R8 of the pump light L1 and the emission region R9 of the pump light L1 face each other in the Z direction, the incidence region R6 of the probe light L2 and the emission region R7 of the probe light L2 face each other in the X direction, and the width W5 of the long side of each of the incidence region R8 and the emission region R9 of the pump light L1 is larger than the width W4 of one side of each of the incidence region R6 and the emission region R7 of the probe light L2. As a result, for example, when viewed from the Z direction, the width W5 of each of the incidence region R8 and the emission region R9 of the pump light becomes larger than the width of the optical path of the probe light. As a result, it is possible to more reliably pump the alkali metal vapor in the optical path of the probe light L2.

In the optically pumped magnetometer module 1, the area of each of the incidence region R8 and the emission region R9 of the pump light L1 is larger than the area of each of the incidence region R6 and the emission region R7 of the probe light L2. Thus, it is possible to more reliably pump the alkali metal vapor in the optical path of the probe light L2.

In the optically pumped magnetometer module 1, the support 7 positions the cell unit 10 at a predetermined position in the housing 2. As a result, the cell 11 is accurately fixed to a predetermined place in the housing 2. As a result, it is possible to more accurately measure the magnetic field in the measurement target.

In the optically pumped magnetometer module 1, each of the incidence region R6 and the emission region R7 of the probe light L2 is located on the first surface 11c side with respect to the center of each of the third surface 11e and the fourth surface 11f in the Y direction, and each of the incidence region R8 and the emission region R9 of the pump light L1 is located on the first surface 11c side with respect to the center of each of the fifth surface 11g and the sixth surface 11h in the Y direction. As a result, other members such as the heater 13 and the temperature detection unit 14 can be disposed in a region close to the second surface 11d side on the third surface 11e, the fourth surface 11f, the fifth surface 11g, and the sixth surface 11h. As a result, when the probe light L2 and the pump light L1 pass through the cell 11, it is suppressed that the intensity and polarization state of the probe light L2 and the pump light L1 change due to other than the spin-polarized state of the alkali metal vapor inside the cell 11. Furthermore, since the optical path of the probe light L2 is closer to the first surface 11c side in the Y direction, the distance between the optical path of the probe light L2 and the measurement target becomes smaller. From the above, the magnetic field in the measurement target can be measured with higher sensitivity.

In the optically pumped magnetometer module 1, the width W1 of the main body portion 11a in the X direction is larger than the width W3 of the main body portion 11a in the Z direction. Here, the longer the width W1 of the main body portion 11a in the X direction, the longer the distance that the probe light L2 passes through the alkali metal vapor pumped by the pump light L1. The longer the distance that the probe light L2 passes through the alkali metal vapor, the more the detection sensitivity of the magnetic field of the optically pumped magnetometer module 1 is improved. Therefore, the detection sensitivity of the magnetic field of the optically pumped magnetometer module 1 can be improved.

Modification Examples

The present disclosure is not limited to the above embodiment. In the optically pumped magnetometer module 1, the pump light L1 only needs to be able to pump alkali metal vapor inside the cell 11. Therefore, for example, the main body portion 11*a* may not include the emission region R9 of the pump light L1. In this case, the heat conductive member 12 is continuously provided over the entire region of the first surface 11*c*, the second surface 11*d*, the third surface 11*e*, the fourth surface 11*f*, the fifth surface 11*g*, and the sixth surface 11*h* of the main body portion 11*a* excluding the incidence region R8 of the pump light L1, the incidence region R6 of the probe light L2, and the emission region R7 of the probe light L2, which are the light-passing regions LR. That is, the heat conductive member 12 is continuously provided over the entire region of the outer surface 110 of the main body portion 11*a* excluding the light-passing regions LR. Specifically, the heat conductive member 12 is provided without a gap in a certain region, and the region is not exposed to the outside. The heat conductive member 12 has the first surface 12*c*, the second surface 12*d*, the third surface 12*e*, the fourth surface 12*f*, the fifth surface 12*g*, and the sixth surface 12*h*, and these surfaces are in contact with each other on adjacent surfaces, and are thermally connected to each other. As a result, the heat generated from the heater 13 is conducted to the entire outer surface 110 of the cell 11 via each surface of the heat conductive member 12, such that the cell 11 can be uniformly heated. Therefore, it is possible to provide an optically pumped magnetometer module 1 capable of uniformly heating the cell 11. In the optically pumped magnetometer module 1, the cell 11 is uniformly heated, such that the measurement sensitivity of the magnetic field and the stability of the measurement are improved. Furthermore, uniform heating of the cell 11 reduces the amount of energy required to heat the lowest temperature portion of the cell 11 to a target temperature. As a result, since the power consumption in the optically pumped magnetometer module 1 is suppressed, noise when measuring the magnetic field is reduced.

The present disclosure is not limited to the above embodiment. In the optically pumped magnetometer module 1, the pump light L1 only needs to be able to pump alkali metal vapor inside the cell 11. Therefore, the probe light L2 may also serve as the pump light L1, or the pump light L1 and the probe light L2 may share the incidence region and the emission region in the main body portion 11*a*. In other words, the main body portion 11*a* only needs to have one incidence region and one emission region. As an example, the main body portion 11*a* may not include the incidence region R8 and the emission region R9 of the pump light L1. In this case, for example, the heat conductive member 12 may be continuously provided over the entire region of the first surface 11*c*, the second surface 11*d*, the third surface 11*e*, the fourth surface 11*f*, the fifth surface 11*g*, and the sixth surface 11*h* of the main body portion 11*a* excluding the incidence region R6 of the probe light L2 and the emission region R7 of the probe light L2, which are the light-passing regions LR. As a result, the heat generated from the heater 13 is conducted to the entire outer surface 110 of the cell 11 via each surface of the heat conductive member 12, such that the cell 11 can be uniformly heated.

In the above-described embodiment, the protrusion 11*b* may not be covered with the heat conductive member 12. Specifically, the protrusion 11*b* may not be covered with the second surface 12*d* of the heat conductive member 12.

In the above-described embodiment, each of the heat conductive members 5 and 12 only needs to be able to conduct heat. In the present embodiment, each of the heat conductive members 5 and 12 is a graphite sheet, but may be a nonmetallic material having no magnetism, and for example, may be a silicon-based heat conduction sheet, an acryl-based heat conduction sheet, or a high thermal conduction resin such as thin film polyimide. As described above, by adopting a nonmetallic material having no magnetism as the heat conductive member, the influence of the external magnetic field can be reduced. As a result, the magnetic field in the measurement target can be measured with higher sensitivity.

In the above-described embodiment, each of the heat conductive members 5 and 12 only needs to be able to cover the place where it is provided without a gap. For example, each of the heat conductive members 5 and 12 is not limited to an integrally formed sheet-like member, and may be each of a plurality of portions provided continuously with each other.

In the above-described embodiment, the optically pumped magnetometer module 1 may include a light receiving element that receives the pump light L1 emitted from the emission region R9 of the pump light L1. According to this, the attenuation amount of the pump light L1 can be efficiently monitored. As a result, the alkali metal vapor in the cell 11 can be more reliably pumped.

In the above-described embodiment, the incidence region R6 and the emission region R7 of the probe light L2 need only be larger than the laser diameter of the probe light L2. For example, when the laser diameter of the probe light L2 is 1 mm, the incidence region R6 and the emission region R7 of the probe light L2 may have a rectangular shape with one side of 1 mm or a circular shape with a diameter of 1 mm.

In the above-described embodiment, as the width W5 of the long sides of the incidence region R8 and the emission region R9 of the pump light L1 is longer, the metal vapor included in the optical path of the probe light L2 is more reliably pumped by the pump light L1. Therefore, the width W5 of the long sides of the incidence region R8 and the emission region R9 of the pump light L1 only needs to be equal to or less than the width W1 of the main body portion 11*a* along the X direction.

In the above-described embodiment, the width W5 of the short sides of the incidence region R8 and the emission region R9 of the pump light L1 only needs to be larger than the laser diameter of the pump light L1. For example, when the laser diameter of the pump light L1 is 1 mm, the width W5 of the short sides of the incidence region R8 and the emission region R9 of the pump light L1 only needs to be 1 mm or more.

In the above-described embodiment, as the incidence region R6 and the emission region R7 of the probe light L2 and the incidence region R8 and the emission region R9 of the pump light L1 are larger, the temperature in each of the above regions decreases, and the uniformity of heating in the cell 11 is impaired. Therefore, the area of each of the regions may be reduced while maintaining a state in which the probe light L2 or the pump light L1 can pass through each of the regions.

In the above-described embodiment, the heater 13 and the temperature detection unit 14 only need to be in contact with the heat conductive member 12, and thus may be formed on any one of the first surface 12c, the second surface 12d, the third surface 12e, the fourth surface 12f, the fifth surface 12g, and the sixth surface 12h.

In the embodiment described above, the heater 13 may be provided on the incidence region R6 of the probe light L2, the emission region R7 of the probe light L2, the incidence region R8 of the pump light L1, or the emission region R9 of the pump light L1 as long as it has optical transparency.

In the above-described embodiment, it is only necessary that the heat conducted to the heat conductive member 5 is prevented from being conducted to the first light receiving element 49a and the second light receiving element 49b. Therefore, it is only necessary that the heat conductive member 5 is not provided at least in regions corresponding to the first light receiving element 49a (light receiving element) and the second light receiving element 49b (light receiving element). For example, the heat conductive member 5 may not be provided in regions corresponding to the first light receiving element 49a and the second light receiving element 49b on the inner surfaces 22a, 22b, 22c, and 22d of the housing 2. That is, the heat conductive member 5 may be provided in regions of the inner surfaces 22a, 22b, 22c, and 22d of the housing 2 excluding regions corresponding only to the first light receiving element 49a and the second light receiving element 49b. Specifically, when viewed from the thickness direction of a certain second wall portion 22, the heat conductive member 5 may be provided in regions of the inner surfaces 22a, 22b, 22c, and 22d of the second wall portion 22, excluding regions overlapping the first light receiving element 49a and the second light receiving element 49b. More specifically, the second portion 52a may be provided in a region of the inner surface 22a excluding regions facing the first light receiving element 49a and the second light receiving element 49b, and the second portion 52b may be provided in a region of the inner surface 22b excluding regions facing the first light receiving element 49a and the second light receiving element 49b.

REFERENCE SIGNS LIST

1 Optically pumped magnetometer module
2 Housing
5 Heat conductive member (second heat conductive member)
6 Wiring
7 Support
10 Cell unit
11 Cell
11a Main body portion
12 Heat conductive member (first heat conductive member)
13 Heater
15 Heat insulating member
16 Opening
16a Incidence opening of probe light
16b Emission opening of probe light
16c Incidence opening of pump light
16d Emission opening of pump light
21 First wall portion (wall portion)
21a Inner surface
22 Second wall portion
22a, 22b, 22c, 22d Inner surface
47 Light receiving unit
48 Substrate

49a First light receiving element (light receiving element)
49b Second light receiving element (light receiving element)
61 Intermediate portion (part)
110 Outer surface
L1 Pump light
L2 Probe light
LR Light-passing region
R1, R2, R3, R4, R5 Region
R6 Incidence region of probe light
R7 Emission region of probe light
R8 Incidence region of pump light
R9 Emission region of pump light

The invention claimed is:

1. An optically pumped magnetometer module comprising:
   a housing;
   a cell unit disposed in the housing, the cell unit including a cell enclosing an alkali metal, a first heat conductive member covering the cell, and a heater provided to the first heat conductive member; and
   a second heat conductive member disposed in the housing, wherein
   the cell includes a main body portion having a light-passing region through which at least one of pump light and probe light passes,
   the first heat conductive member is continuously provided over an entire region of an outer surface of the main body portion excluding the light-passing region, and
   the second heat conductive member is provided on an inner surface of the housing.

2. The optically pumped magnetometer module according to claim 1, wherein
   the first heat conductive member has an opening corresponding to the light-passing region,
   the cell unit further has a heat insulating member covering the first heat conductive member and the heater, and
   the heat insulating member is provided over an entire portion of the first heat conductive member excluding the opening.

3. The optically pumped magnetometer module according to claim 1, further comprising:
   a light receiving element disposed in the housing and configured to receive the probe light emitted from the cell, wherein
   the second heat conductive member is not provided in a region of the inner surface of the housing, the region corresponding to the light receiving element.

4. The optically pumped magnetometer module according to claim 3, further comprising:
   a substrate on which the light receiving element is mounted, wherein
   the second heat conductive member is not provided in regions of the inner surface of the housing, the regions corresponding to the light receiving element and the substrate.

5. The optically pumped magnetometer module according to claim 1, wherein
   the light-passing region includes an incidence region of the pump light, an incidence region of the probe light, and an emission region of the probe light facing the incidence region of the probe light in a second direction perpendicular to a first direction in which the pump light is incident on the incidence region of the pump light, and
   a width of the incidence region of the pump light in a third direction perpendicular to both the first direction and the second direction is larger than a width of each of the incidence region of the probe light and the emission region of the probe light in the third direction.

6. The optically pumped magnetometer module according to claim 5, wherein an area of the incidence region of the pump light is larger than an area of each of the incidence region of the probe light and the emission region of the probe light.

7. The optically pumped magnetometer module according to claim 1, further comprising: a support disposed in the housing and configured to position the cell unit at a predetermined position in the housing.

8. The optically pumped magnetometer module according to claim 1, wherein the housing has a wall portion, and the cell unit is disposed in the housing such that no space is formed between the wall portion and the cell unit.

9. An optically pumped magnetometer module comprising:

a housing; and a cell unit disposed in the housing, wherein the cell unit has a cell enclosing an alkali metal, a first heat conductive member covering the cell, and a heater provided to the first heat conductive member, the cell includes a main body portion having a light-passing region through which at least one of pump light and probe light passes, the first heat conductive member is continuously provided over an entire region of an outer surface of the main body portion excluding the light-passing region, the light-passing region includes an incidence region of the pump light, an incidence region of the probe light, and an emission region of the probe light facing the incidence region of the probe light in a second direction perpendicular to a first direction in which the pump light is incident on the incidence region of the pump light, and a width of the incidence region of the pump light in a third direction perpendicular to both the first direction and the second direction is larger than a width of each of the incidence region of the probe light and the emission region of the probe light in the third direction.

10. The optically pumped magnetometer module according to claim 9, wherein the first heat conductive member has an opening corresponding to the light-passing region, the cell unit further has a heat insulating member covering the first heat conductive member and the heater, and the heat insulating member is provided over an entire portion of the first heat conductive member excluding the opening.

11. The optically pumped magnetometer module according to claim 9, further comprising:

a second heat conductive member disposed in the housing, and a light receiving element disposed in the housing and configured to receive the probe light emitted from the cell, wherein the second heat conductive member is provided on an inner surface of the housing, and the second heat conductive member is not provided in a region of the inner surface of the housing, the region corresponding to the light receiving element.

12. The optically pumped magnetometer module according to claim 11, further comprising:

a substrate on which the light receiving element is mounted, wherein the second heat conductive member is not provided in regions of the inner surface of the housing, the regions corresponding to the light receiving element and the substrate.

13. The optically pumped magnetometer module according to claim 9, wherein an area of the incidence region of the pump light is larger than an area of each of the incidence region of the probe light and the emission region of the probe light.

14. The optically pumped magnetometer module according to claim 9, further comprising: a support disposed in the housing and configured to position the cell unit at a predetermined position in the housing.

15. The optically pumped magnetometer module according to claim 9, wherein the housing has a wall portion, and the cell unit is disposed in the housing such that no space is formed between the wall portion and the cell unit.

* * * * *